(12) United States Patent
Tsuyutani et al.

(10) Patent No.: US 11,682,628 B2
(45) Date of Patent: Jun. 20, 2023

(54) SEMICONDUCTOR IC-EMBEDDED SUBSTRATE HAVING HEAT DISSIPATION STRUCTURE AND ITS MANUFACTURING METHOD

(71) Applicant: TDK Corporation, Tokyo (JP)

(72) Inventors: Kazutoshi Tsuyutani, Tokyo (JP); Masashi Katsumata, Tokyo (JP); Yoshihiro Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 106 days.

(21) Appl. No.: 16/711,047

(22) Filed: Dec. 11, 2019

(65) Prior Publication Data
US 2020/0194375 A1 Jun. 18, 2020

(30) Foreign Application Priority Data
Dec. 13, 2018 (JP) .............................. JP2018-233809

(51) Int. Cl.
*H01L 23/538* (2006.01)
*H01L 23/00* (2006.01)
(Continued)

(52) U.S. Cl.
CPC ...... *H01L 23/5389* (2013.01); *H01L 23/5383* (2013.01); *H01L 23/5386* (2013.01);
(Continued)

(58) Field of Classification Search
CPC . H01L 23/5389; H01L 34/5383; H01L 24/08; H01L 25/16; H01L 23/5386; H01L 2224/0903; H01L 2224/08225; H01L 2224/0913; H01L 24/19; H01L 24/82; H01L 23/3677; H01L 21/4857; H01L 24/24; H01L 23/145; H01L 2224/15227; H01L 24/73; H01L 2224/12105;
(Continued)

(56) References Cited

U.S. PATENT DOCUMENTS 10,093,975 B2 * 10/2018 Esfandyarpour ....... B03C 1/286
2009/0211799 A1    8/2009 Nagase et al.
(Continued)

FOREIGN PATENT DOCUMENTS

JP       07-231172 A     8/1995
JP     2013-229548 A    11/2013
(Continued)

*Primary Examiner* — Herve-Louis Y Assouman
(74) *Attorney, Agent, or Firm* — McDermott Will & Emery LLP

(57) ABSTRACT

Disclosed herein is a semiconductor IC-embedded substrate that includes insulating layers, conductor layers, and a semiconductor IC embedded in the insulating layers. The insulating layers includes first and second insulating layers. The conductor layers includes a first conductor layer having a first wiring pattern and a second conductor layer having a second wiring pattern. The semiconductor IC includes a rewiring pattern connected in common to power supply pads. The rewiring pattern is connected to the first wiring pattern via a first opening of the first insulating layer. The
(Continued)

first wiring pattern is connected to the second wiring pattern via second openings of the second insulating layer. The first opening is greater in area than each of the second openings.

20 Claims, 26 Drawing Sheets

(51) Int. Cl.
*H01L 23/16* (2006.01)
*H01L 25/16* (2023.01)

(52) U.S. Cl.
CPC .............. *H01L 24/08* (2013.01); *H01L 24/09* (2013.01); *H01L 25/16* (2013.01); *H01L 2224/08225* (2013.01); *H01L 2224/0903* (2013.01); *H01L 2224/0913* (2013.01)

(58) Field of Classification Search
CPC . H01L 2924/19041; H01L 2924/19042; H01L 24/32; H01L 2224/73267; H01L 2224/04105; H01L 24/92; H01L 2224/92244; H01L 2224/24226; H01L 2224/32225; H01L 23/538; H01L 23/00
USPC ......................................................... 257/668
See application file for complete search history.

(56) References Cited

U.S. PATENT DOCUMENTS

| | | | | |
|---|---|---|---|---|
| 2012/0247819 | A1* | 10/2012 | Tsuyutani | ............... H01L 24/82 174/257 |
| 2013/0026632 | A1 | 1/2013 | Kikuchi et al. | |
| 2014/0104803 | A1* | 4/2014 | Tsuyutani | ............... H01L 24/24 361/783 |
| 2017/0069532 | A1* | 3/2017 | Lee | ......................... H01L 24/20 |
| 2017/0077043 | A1* | 3/2017 | Takemura | ......... H01L 23/49827 |
| 2018/0337131 | A1* | 11/2018 | Tsuyutani | ............... H01L 24/20 |
| 2019/0172809 | A1* | 6/2019 | Oh | ........................... H01L 24/20 |
| 2019/0287924 | A1* | 9/2019 | Moon | ................... H01L 23/562 |
| 2020/0109047 | A1* | 4/2020 | Tsuyutani | ............ H04R 19/005 |
| 2020/0135679 | A1* | 4/2020 | Darmawaikarta | ......................... H01L 23/49816 |
| 2020/0203278 | A1* | 6/2020 | Tsuyutani | ............... H01L 24/19 |
| 2020/0288574 | A1* | 9/2020 | Ito | ............................ H01F 27/29 |
| 2021/0280517 | A1* | 9/2021 | May | .................... H01L 23/5381 |

FOREIGN PATENT DOCUMENTS

| | | | | |
|---|---|---|---|---|
| JP | 2018-195742 | * | 12/2018 | ............... H05K 3/46 |
| JP | 6512366 | B2 * | 5/2019 | |
| JP | 2020-13835 | * | 1/2020 | ............... H05K 3/46 |
| WO | 2017183135 | A1 * | 10/2017 | |

* cited by examiner

SEMICONDUCTOR IC-EMBEDDED SUBSTRATE HAVING HEAT DISSIPATION STRUCTURE AND ITS MANUFACTURING METHOD

CROSS-REFERENCE TO RELATED APPLICATIONS

The disclosure of Japanese Patent Application No. 2018-233809 filed on Dec. 13, 2018 including the specification, drawings and abstract is incorporated herein by reference in its entirety.

BACKGROUND OF THE INVENTION

Field of the Invention

The present invention relates to a semiconductor IC-embedded substrate and its manufacturing method and, more particularly, to a semiconductor IC-embedded substrate in which a heat dissipation property from a semiconductor IC is improved and its manufacturing method.

Description of Related Art

As a semiconductor IC-embedded substrate having a semiconductor IC embedded therein, there is one described in JP 2013-229548 A. The semiconductor IC-embedded substrate described in JP 2013-229548 A has a plurality of thermal vias contacting the back surface of a semiconductor IC, whereby a heat dissipation property from the semiconductor IC is improved. A pad electrode formed on the main surface of the semiconductor IC is connected to its corresponding wiring pattern through another via conductor provided on the main surface side of the semiconductor IC.

However, in the semiconductor IC-embedded substrate described in JP 2013-229548A, both the via conductor contacting the main surface of the semiconductor IC and another via conductor contacting the back surface thereof need to be formed. This complicates the structure and increases the number of manufacturing processes.

SUMMARY

It is therefore an object of the present invention to provide a semiconductor IC-embedded substrate capable of achieving a high heat dissipation property with a simpler structure and its manufacturing method.

A semiconductor IC-embedded substrate according to the present invention includes a plurality of insulating layers, a plurality of conductor layers and a semiconductor IC embedded in at least one of the plurality of insulating layers. The semiconductor IC includes a plurality of pad electrodes provided on the main surface thereof and a rewiring layer connected to the plurality of pad electrodes. The rewiring layer includes a rewiring pattern connected in common to a plurality of power supply pads included in the plurality of electrode pads. The plurality of insulating layers include a first insulating layer that covers the main surface of the semiconductor IC. The first insulating layer includes a first opening exposing the rewiring pattern at a location overlapping the plurality of power supply pads. The plurality of conductor layers include a first conductor layer provided on the first insulating layer. The first conductor layer includes a first wiring pattern connected to the rewiring pattern through the first opening. The plurality of insulating layers further include a second insulating layer that covers the first conductor layer. The second insulating layer includes a plurality of second openings formed at a location overlapping the first opening. The plurality of conductor layers further include a second conductor layer provided on the second insulating layer. The second conductor layer includes a second wiring pattern connected to the first wiring pattern through the plurality of second openings.

According to the present invention, heat generated by the semiconductor IC is efficiently dissipated from the main surface side of the semiconductor IC through the plurality of power supply pads, rewiring pattern, first wiring pattern and second wiring pattern, making it possible to achieve a high heat dissipation property with a simpler structure. Further, the first opening connecting the rewiring pattern and the first wiring pattern has a large diameter overlapping the plurality of power supply pads and the plurality of second openings, making it possible to rapidly transmit heat dissipated from the semiconductor IC through the plurality of power supply pads to the second wiring pattern.

In the present invention, any of the plurality of power supply pads and any of the plurality of second openings may overlap each other in a plan view. With this configuration, a heat conducting distance between the power supply pads and the second wiring pattern is reduced, making it possible to further improve the heat dissipation property.

In the present invention, the arrangement pitch of the plurality of power supply pads and the arrangement pitch of the plurality of second openings may differ from each other. With this configuration, even when slight misalignment occurs in a manufacturing process, any of the plurality of power supply pads and any of the second openings overlap each other in a plan view.

In the present invention, the arrangement pitch of the plurality of second openings may be smaller or larger than the arrangement pitch of the plurality of power supply pads. In the former case, the heat dissipation property can be made more uniform on a planar basis. In the latter case, the diameter of the second opening can be made larger.

In the present invention, the surface of the second wiring pattern may have recesses overlapping the plurality of second openings, respectively. With this configuration, the surface area of the second wiring pattern is increased, making it possible to further improve the heat dissipation property.

In the present invention, the plurality of conductor layers may further include a third conductor layer positioned on the back surface side of the semiconductor IC, the second conductor layer may be connected to the third conductor layer at a location not overlapping the semiconductor IC in a plan view through a via conductor formed inside a via penetrating at least one of the plurality of insulating layers, the via may have a shape in which the diameter thereof is reduced in the depth direction, the via may have a first section positioned on one of the second conductor layer side and the third conductor layer side and a second section positioned on the other one thereof, and a reduction in the diameter per unit depth in the first section may be larger than that in the second section. With the above configuration, the angle of the edge of the via positioned at the end portion of the first section is alleviated, making it possible to increase the connection reliability of the via conductor.

A method for manufacturing a semiconductor IC-embedded substrate according to the present invention includes: covering a main surface of the semiconductor IC with a first insulating layer, the semiconductor IC having a plurality of pad electrodes provided on the main surface thereof and a rewiring layer connected to the plurality of pad electrodes, the rewiring layer including a rewiring pattern connected in common to a plurality of power supply pads included in the plurality of pad electrodes; forming a first opening in the first insulating layer to expose the rewiring pattern at a location overlapping the plurality of power supply pads; forming a first conductor layer on the first insulating layer to connect a first wiring pattern included in the first conductor layer to the rewiring pattern through the first opening; forming a second insulating layer covering the first conductor layer; forming a plurality of second openings in the second insulating layer to expose the first wiring pattern at a location overlapping the first opening; and forming a second conductor layer on the second insulating layer to connect a second wiring pattern included in the second conductor layer to the first wring pattern through the plurality of second openings.

According to the present invention, it is possible to manufacture a semiconductor IC-embedded substrate having a high heat dissipation property without forming a thermal via exposing the back surface of the semiconductor IC.

Thus, according to the present invention, there can be provided a semiconductor IC-embedded substrate capable of achieving a high heat dissipation property with a simpler structure and its manufacturing method.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
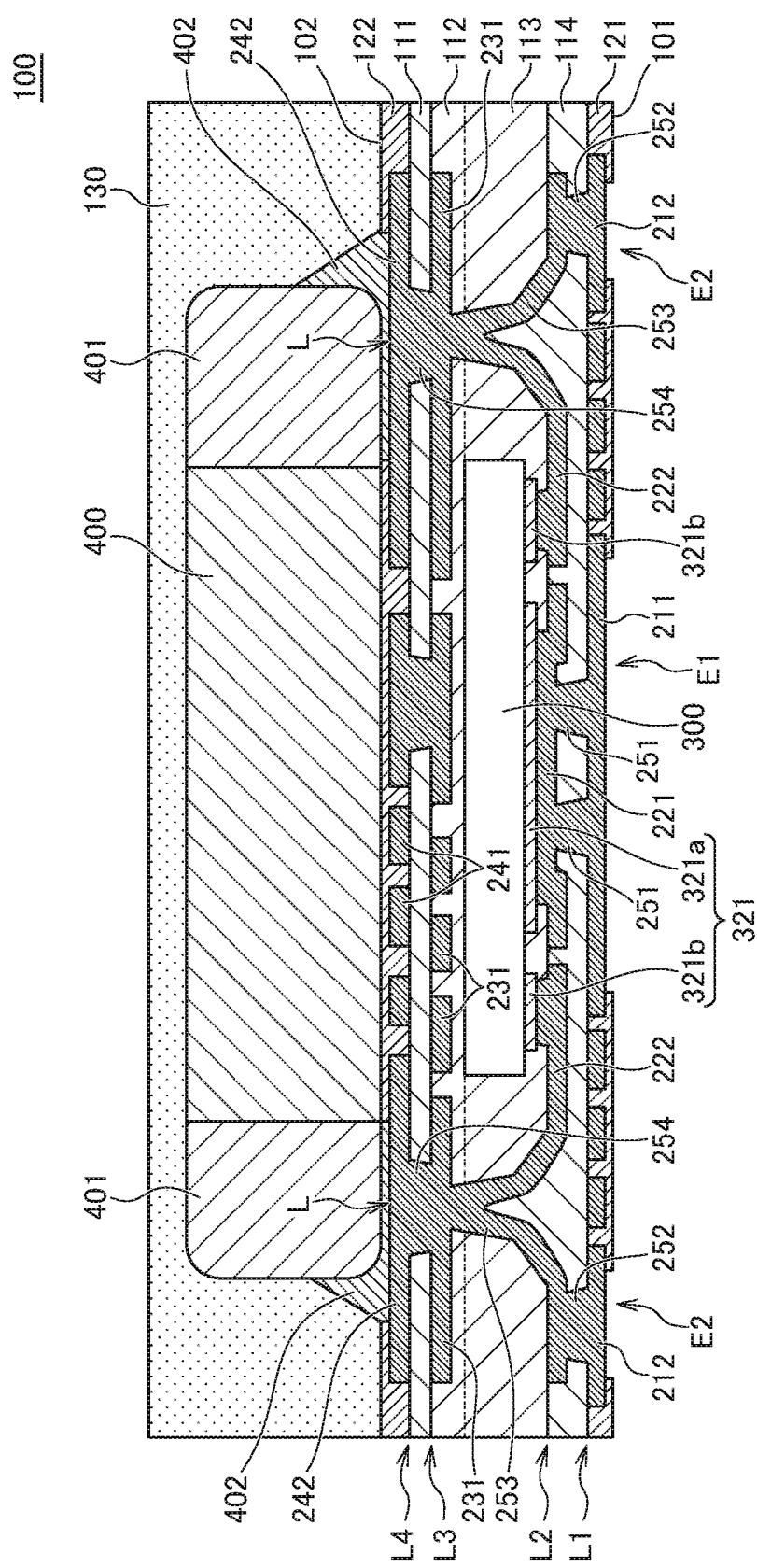
FIG. 1 is a schematic cross-sectional view for explaining the structure of a semiconductor IC-embedded substrate according to a preferred embodiment of the present invention.

FIG. 1 is a schematic cross-sectional view for explaining the structure of a semiconductor IC-embedded substrate 100 according to a preferred embodiment of the present invention.

As illustrated in FIG. 1, the semiconductor IC-embedded substrate 100 according to the present embodiment includes four insulating layers 111 to 114 and conductor layers L1 to L4 positioned on the surfaces of the respective insulating layers 111 to 114. Although not particularly limited, the insulating layer 111 positioned in the uppermost layer and the insulating layer 114 positioned in the lowermost layer may each be a core layer obtained by impregnating a core material such as glass fiber with a resin material such as glass epoxy. On the other hand, the insulating layers 112 and 113 may each be made of a resin material not including a core material such as glass cloth. Particularly, the thermal expansion coefficient of the insulating layers 111 and 114 is preferably smaller than that of the insulating layers 112 and 113.

The insulating layer 114 positioned in the lowermost layer and the conductor layer L1 formed on the surface of the insulating layer 114 are partially covered by a solder resist 121. Similarly, the insulating layer 111 positioned in the uppermost layer and the conductor layer L4 formed on the surface of the insulating layer 111 are partially covered by a solder resist 122. Although not particularly limited, the solder resist 121 constitutes a lower surface 101 of the semiconductor IC-embedded substrate 100, and the solder resist 122 constitutes an upper surface 102 of the semiconductor IC-embedded substrate 100. In the present embodiment, an electronic component 400 is mounted on the upper surface 102 of the semiconductor IC-embedded substrate 100. The electronic component 400 may be a passive component such as a capacitor or an inductor. The electronic component 400 is sealed with a mold resin 130 covering the upper surface 102 of the semiconductor IC-embedded substrate 100. Only one electronic component 400 is mounted in the example of FIG. 1, but in practice, more electronic components 400 may be mounted.

As illustrated in FIG. 1, the semiconductor IC-embedded substrate 100 according to the present embodiment has a semiconductor IC 300 embedded in the insulating layer 113. The semiconductor IC 300 is embedded such that the main surface thereof having a pad electrode thereon faces the lower surface 101 side, and the back surface thereof faces the upper surface 102 side. Although details will be described later, a rewiring layer 321 connected to the pad electrode is provided on the main surface of the semiconductor IC 300. The rewiring layer 321 includes rewiring patterns 321a and 321b. Although only one semiconductor IC 300 is provided in the example of FIG. 1, two or more semiconductor ICs 300 may be provided.

The conductor layer L1 includes wiring patterns 211 and 212. A part of the wiring pattern 211 that is not covered with the solder resist 121 and a part of the wiring pattern 212 that is not covered with the solder resist 121 constitute external terminals E1 and E2, respectively, of the semiconductor IC-embedded substrate 100. The external terminal E1 is used as a terminal for applying a power supply potential (typically, a ground potential) to the semiconductor IC 300 and for dissipating heat generated by the semiconductor IC 300 to the outside. The external terminal E2 is provided in plural numbers in the semiconductor IC-embedded substrate 100 and used as a signal terminal, a power supply terminal or a dummy terminal.

The conductor layer L2 includes wiring patterns 221 and 222. The wiring pattern 221 is connected to the wiring pattern 211 of the conductor layer L1 through a plurality of via conductors 251 penetrating the insulating layer 114. Only two via conductors 251 are provided in the example of FIG. 1, but in practice, more via conductors 251 may be provided. As illustrated in FIG. 1, the wiring pattern 221 contacts the rewiring pattern 321a of the semiconductor IC 300 over a large area. The wiring pattern 222 is connected to the rewiring pattern 321b of the semiconductor IC 300 and to the wiring pattern 212 of the conductor layer L1 through a via conductor 252 penetrating the insulating layer 114.

The conductor layer L3 includes a wiring pattern 231. A part of the wiring pattern 231 is connected to the wiring pattern 222 of the conductor layer L2 through a plurality of via conductors 253 penetrating the insulating layers 112 and 113. The via conductors 253 are disposed at a location not overlapping the semiconductor IC 300 in a plan view.

The conductor layer L4 includes a wiring pattern 241. A part of the wiring pattern 241 is connected to the wiring pattern 231 of the conductor layer L3 through a plurality of via conductors 254 penetrating the insulating layer 111. Further, a part of the wiring pattern 241 that is not covered with the solder resist 122 constitutes a land pattern L. The land pattern L is connected to a terminal electrode 401 of the electronic component 400 through a solder 402.

Figure 2:
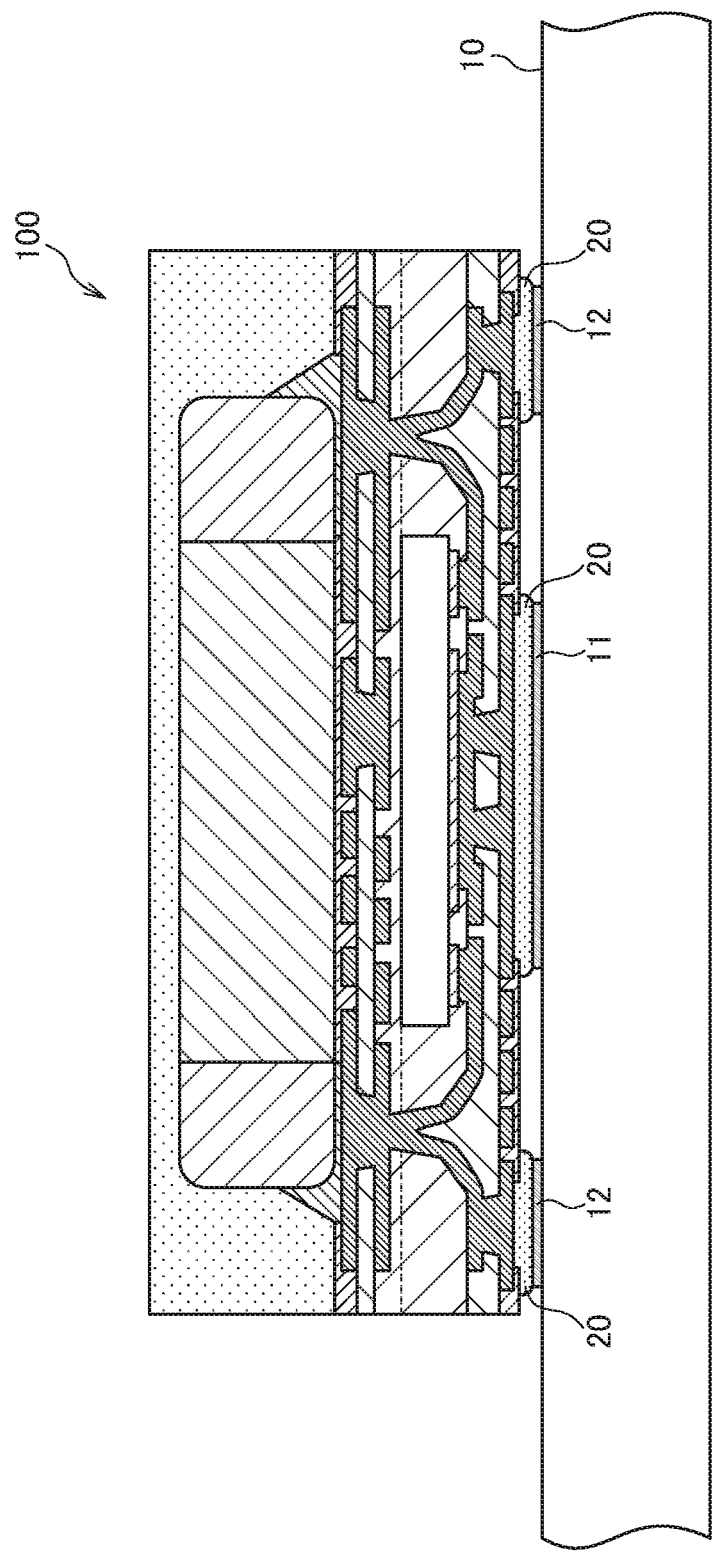
FIG. 2 is a schematic cross-sectional view illustrating a state where the semiconductor IC-embedded substrate shown in FIG. 1 is mounted on a mother board.

FIG. 2 is a schematic cross-sectional view illustrating a state where the semiconductor IC-embedded substrate 100 according to the present embodiment is mounted on a mother board 10. As illustrated in FIG. 2, the semiconductor IC-embedded substrate 100 is mounted such that the lower surface 101 thereof faces the mother board 10, and land patterns 11 and 12 provided on the mother board 10 and the external terminals E1 and E2 of the semiconductor IC-embedded substrate 100 are connected respectively to each other through a solder 20. The land pattern 11 is larger in area than the land pattern 12, whereby heat generated by the semiconductor IC 300 is efficiently dissipated to the outside through the external terminal E1 and the land pattern 11.

Figure 3:
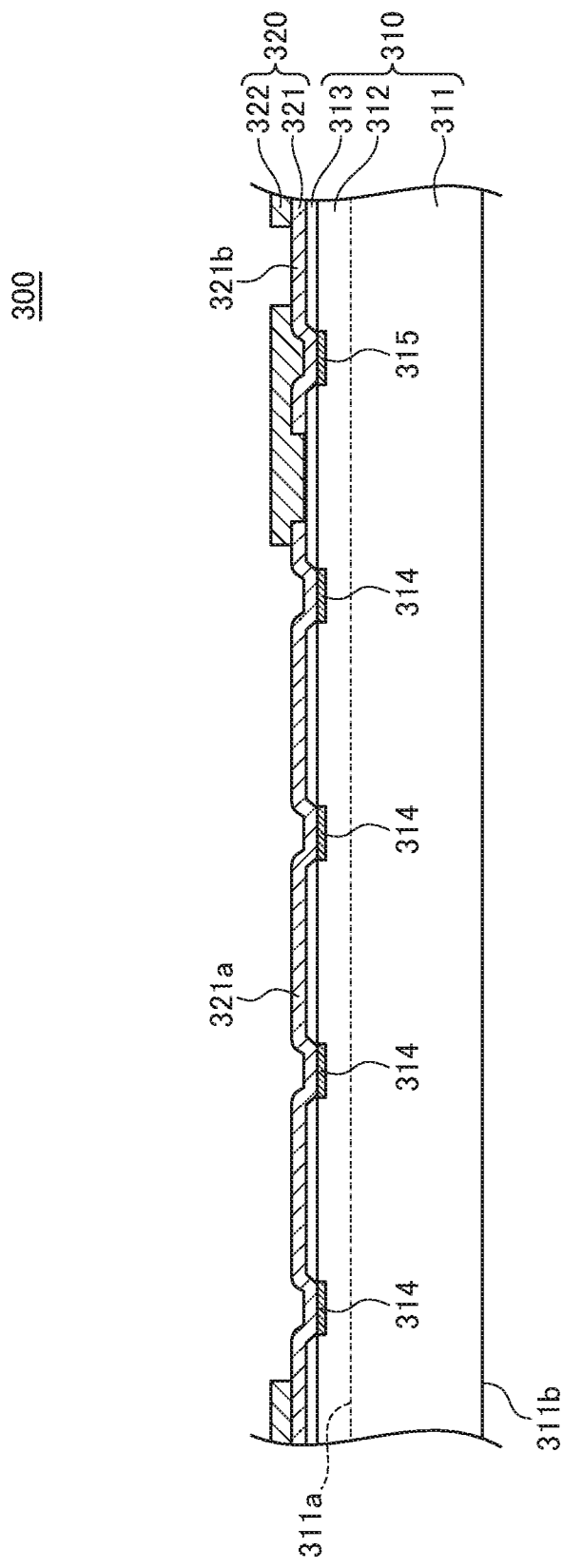
FIG. 3 is a schematic cross-sectional view for explaining the structure of the semiconductor IC.

FIG. 3 is a schematic cross-sectional view for explaining the structure of the semiconductor IC 300.

As illustrated in FIG. 3, the semiconductor IC 300 includes a chip part 310 and a rewiring structure 320 formed on the chip part 310. The chip part 310 includes a semiconductor substrate 311 made of silicon, a multilayer wiring structure 312 formed on a main surface 311a of the semiconductor substrate 311, and a passivation film 313 covering the multilayer wiring structure 312. Circuit elements such as transistors are formed on the main surface 311a of the semiconductor substrate 311. A back surface 311b of the semiconductor substrate 311 is exposed. The semiconductor substrate 311 may be reduced in thickness through polishing or the like applied to the back surface 311b. A plurality of pad electrodes 314 and a plurality of pad electrodes 315 exposed from the passivation film 313 are provided on the surface of the chip part 310.

The rewiring structure 320 includes the rewiring layer 321 that covers the passivation film 313 and a protective film 322 that covers the rewiring layer 321. A part of the rewiring layer 321 that is not covered with the protective film 322 constitutes an external terminal of the semiconductor IC 300. The rewiring layer 321 includes the rewiring patterns 321a and 321b. The rewiring pattern 321a is connected in common to the plurality of pad electrodes 314, and the rewiring pattern 321b is connected to its corresponding pad electrode 315. The pad electrode 314 is a power supply pad for applying a power supply potential (typically, a ground potential) to the semiconductor IC 300. The protective film 322 is made of, e.g., polyimide.

The following more specifically describes the structure of a part of the semiconductor IC-embedded substrate 100 according to the present embodiment that overlaps the semiconductor IC 300 in a plan view using plan views of FIGS. 4 to 7.

Figure 4:
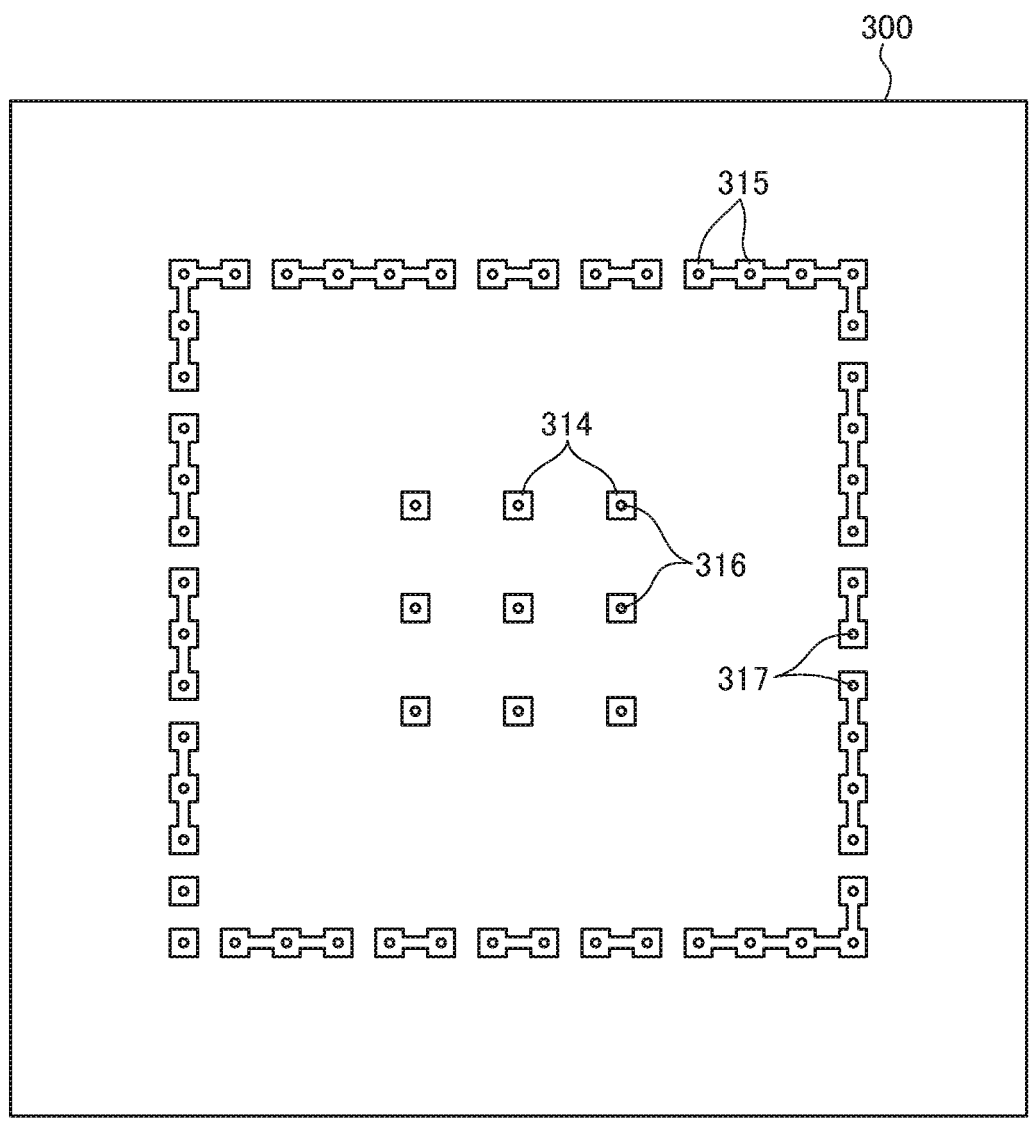
FIG. 4 is a schematic plan view illustrating an example of the shape of the chip part included in the semiconductor IC.

FIG. 4 is a schematic plan view illustrating an example of the shape of the chip part 310 included in the semiconductor IC 300. In the example of FIG. 4, the plurality of (in this example, nine) pad electrodes 314 are arranged in a matrix at the center of the semiconductor IC 300, and the plurality of pad electrodes 315 are disposed so as to surround the pad electrodes 314. Some adjacent pad electrodes 315 may be short-circuited. Reference numerals 316 and 317 in FIG. 4 indicate the formation positions of via conductors connecting the pad electrodes 314, 315 and the rewiring layer 321 formed thereabove.

Figure 5:
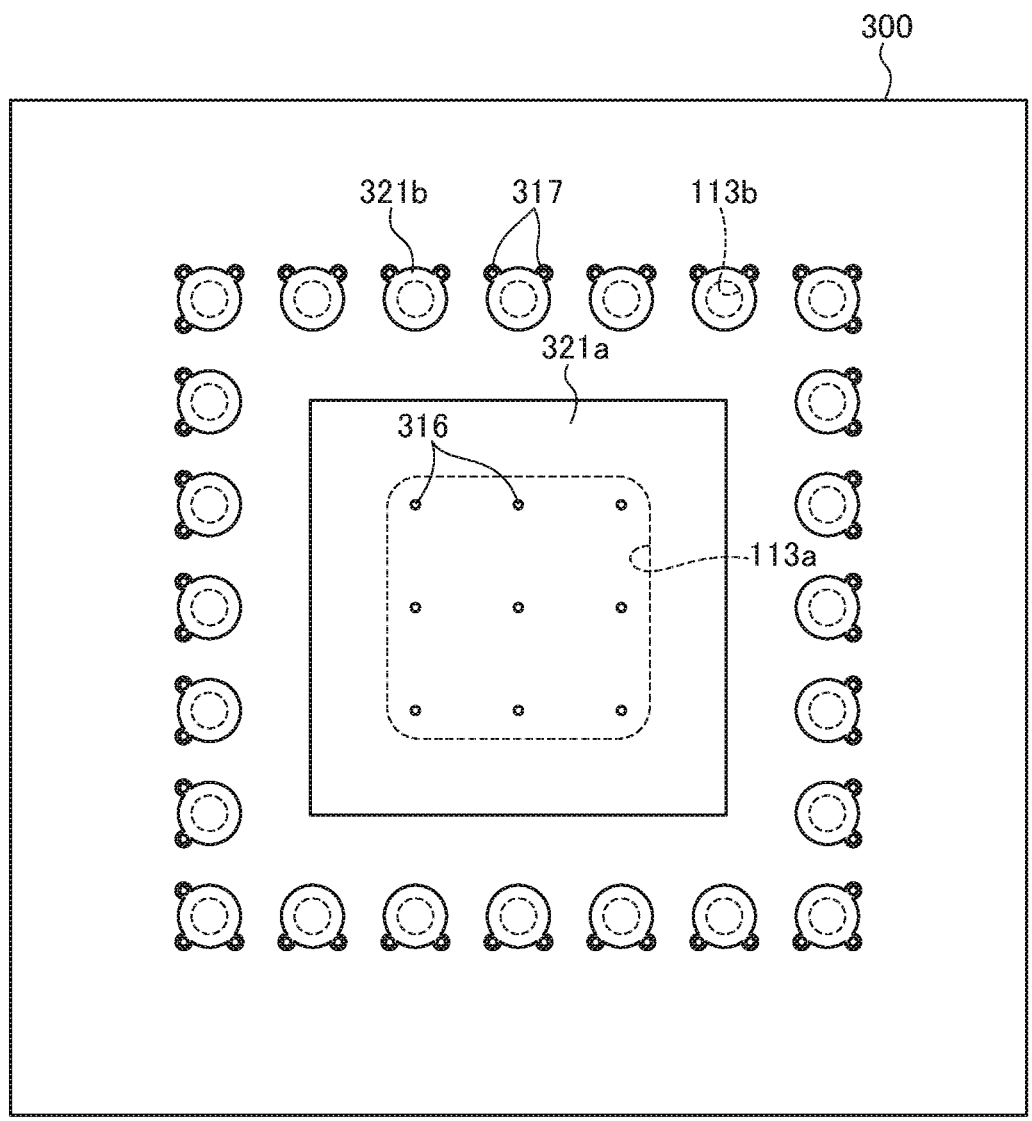
FIG. 5 is a schematic plan view illustrating an example of the shape of the rewiring layer included in the semiconductor IC.

FIG. 5 is a schematic plan view illustrating an example of the shape of the rewiring layer 321 included in the semiconductor IC 300. In the example of FIG. 5, the pad electrodes 314 are connected in common to one rewiring pattern 321a through a plurality of via conductors 316, and the pad electrodes 315 are connected to their corresponding rewiring patterns 321b through a plurality of the respective via conductors 317. As illustrated in FIG. 5, the rewiring pattern 321a is a large-area pattern that covers the plurality of pad electrodes 314. The reference numerals 113a and 113b in FIG. 5 indicate the formation positions of openings formed in the insulating layer 113. The openings 113a and 113b are formed at locations overlapping the rewiring patterns 321a and 321b, respectively, in a plan view. Particularly, the opening 113a is a large-diameter opening formed at a location overlapping the plurality of pad electrodes 314 in a plan view.

Figure 6:
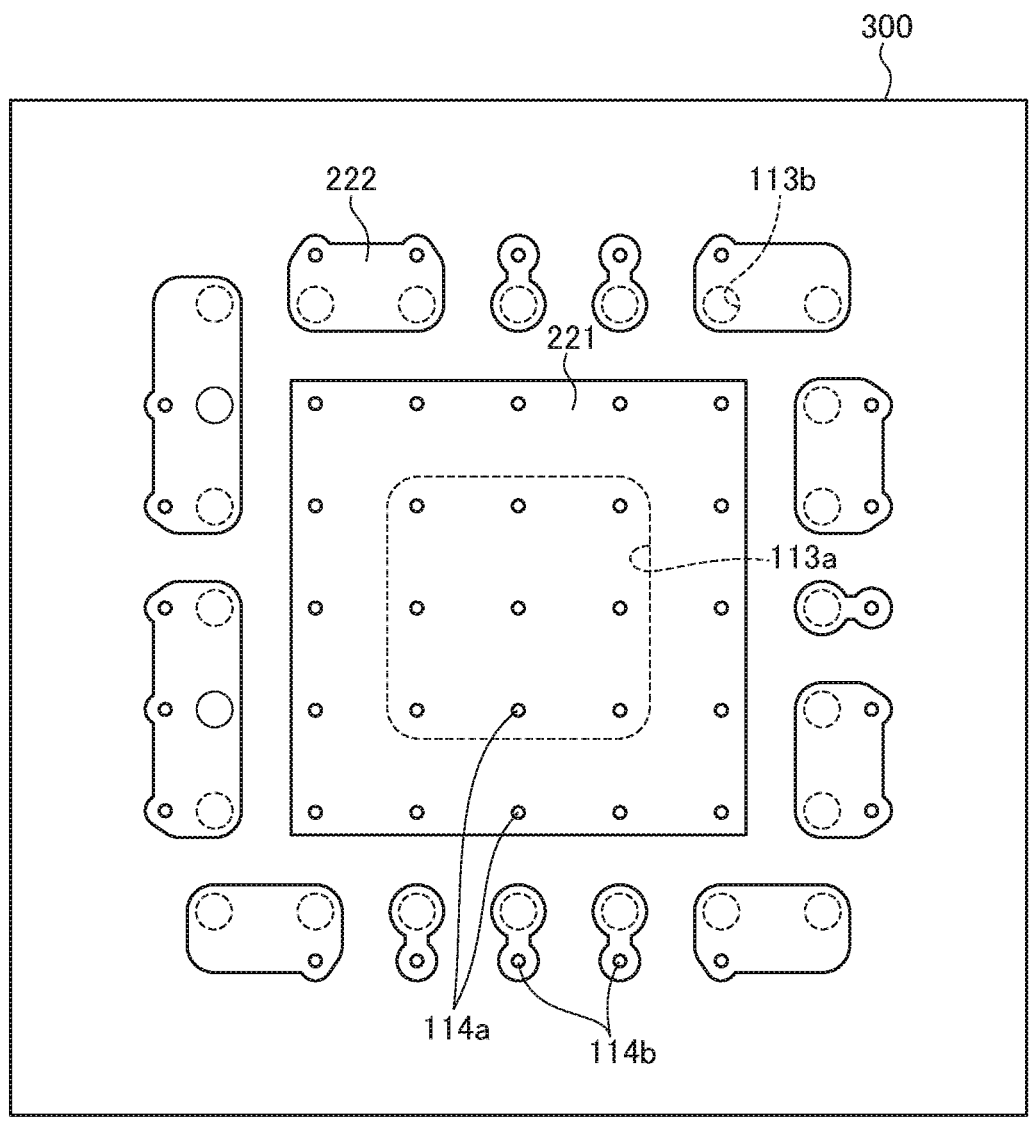
FIG. 6 is a schematic plan view illustrating an example of the shape of a conductor layer at a location overlapping the semiconductor IC.

FIG. 6 is a schematic plan view illustrating an example of the shape of the conductor layer L2 at a location overlapping the semiconductor IC 300. In the example of FIG. 6, the wiring pattern 221 is connected to the rewiring pattern 321a through the large-diameter opening 113a, and the wiring patterns 222 are connected to their corresponding rewiring pattern 321b through a plurality of the respective openings 113b. As illustrated in FIG. 6, the wiring pattern 221 is a large-area pattern that covers the rewiring pattern 321a, and the wiring pattern 221 and the rewiring pattern 321a contact each other through the large-diameter opening 113a. As described above, the opening 113a is formed at a location overlapping the plurality of pad electrodes 314, so that a part of the wiring pattern 221 that is formed in the opening 113a overlaps the plurality of pad electrodes 314 in a plan view. Reference numerals 114a and 114b in FIG. 6 indicate the formation positions of openings formed in the insulating layer 114. The openings 114a and 114b are formed at locations overlapping the wiring patterns 221 and 222, respectively, in a plan view. Particularly, the opening 114a is formed in plural numbers (25 openings, in this example) for the large-area wiring pattern 221. As illustrated in FIG. 6, some openings 114a overlap the opening 113a in a plan view.

Figure 7:
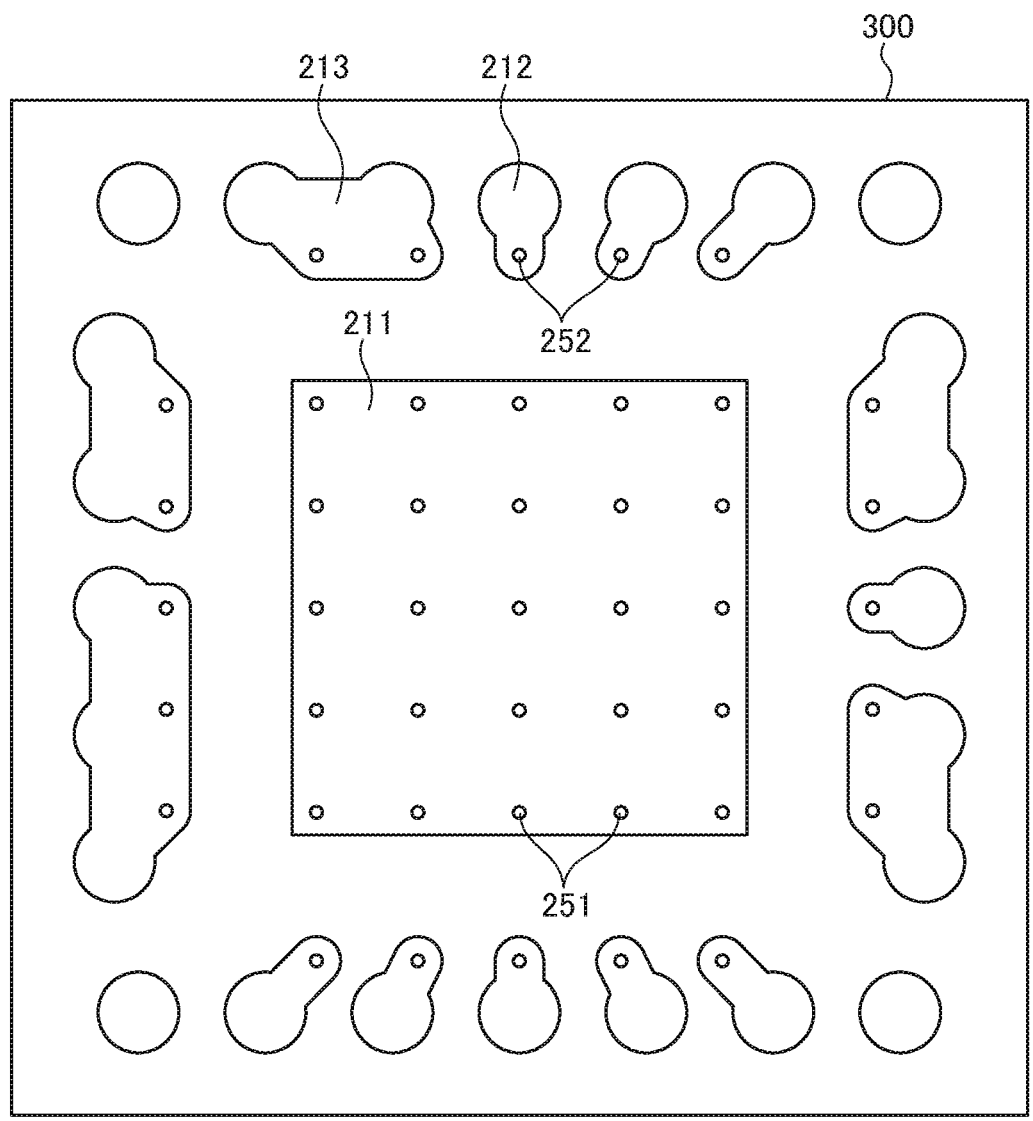
FIG. 7 is a schematic plan view illustrating an example of the shape of another conductor layer at a location overlapping the semiconductor IC.

FIG. 7 is a schematic plan view illustrating an example of the shape of the conductor layer L1 at a location overlapping the semiconductor IC 300. In the example of FIG. 7, the wiring pattern 211 is connected to the wiring pattern 221 through the plurality of via conductors 251, and the wiring patterns 212 are connected to their corresponding wiring patterns 222 through a plurality of the respective via conductors 252. The via conductors 251 and 252 are embedded in the openings 114a and 114b, respectively, and each constitutes a part of the conductor layer L1. As illustrated in FIG. 7, the wiring pattern 211 is a large-area pattern that covers the wiring pattern 221, and the wiring pattern 211 and the wiring pattern 221 contact each other through the plurality of via conductors 251. As described above, some openings 114a overlap the opening 113a in a plan view, so that a part of the wiring pattern 211 overlaps the plurality of pad electrodes 314 in a plan view, which is used as the external terminal E1 illustrated in FIG. 1. On the other hand, a part of the wiring pattern 212 is used as the external terminal E2 illustrated in FIG. 1.

Thus, the plurality of pad electrodes 314 provided at the center of the semiconductor IC 300 are connected to the large-area wiring pattern 211 constituting the external terminal E1 through the large-area rewiring pattern 321a, the large-area wiring pattern 221 and the plurality of via conductors 251. With this configuration, heat generated by the semiconductor IC 300 is rapidly dissipated to the outside through the above heat dissipation path.

As described above, in the present embodiment, the heat dissipation path is formed on the main surface side of the semiconductor IC 300, so that a conductive path for connecting the signal or power supply pad electrodes 315 to their corresponding external terminals E2 and the above heat dissipation path can be formed at the same time. This eliminates the need to form a thermal via that contacts the back surface of the semiconductor IC 300, making it possible to ensure a high heat dissipation property with a simple structure.

Figure 8:
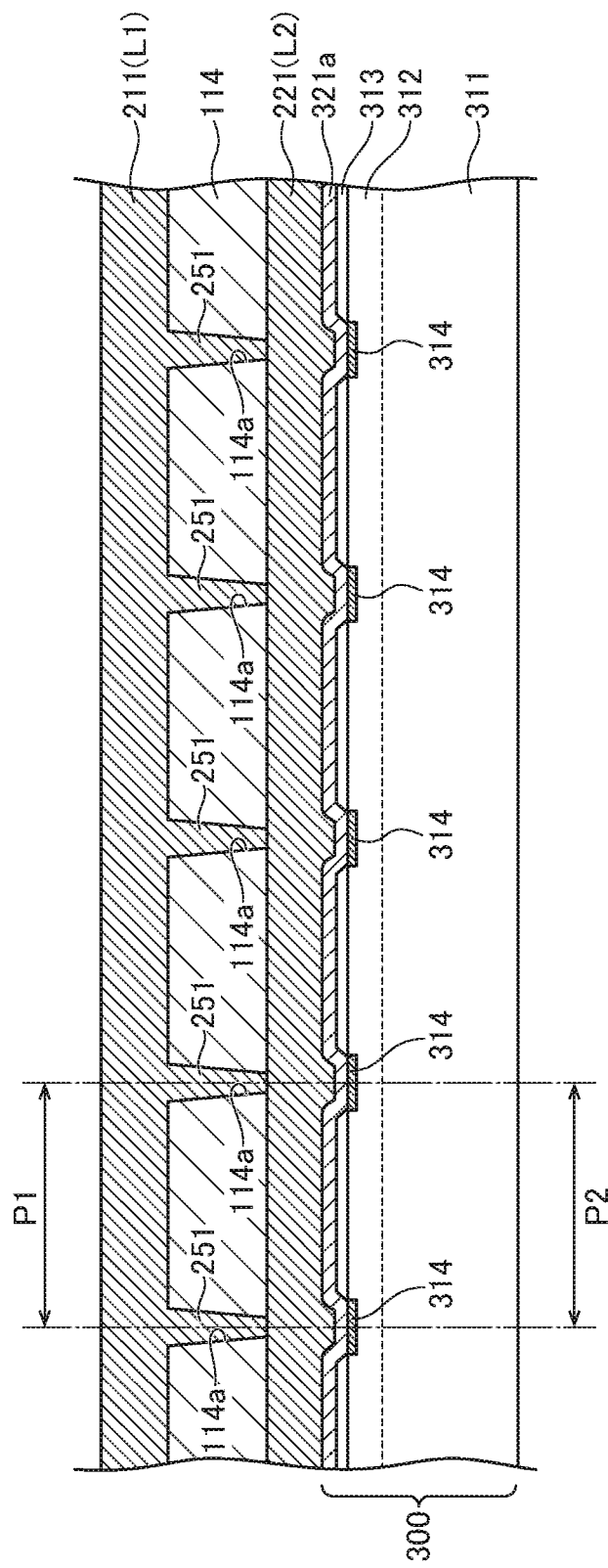
FIG. 8 is a schematic cross-sectional view illustrating a first example of the positional relationship between the pad electrodes and the via conductors (openings)
Figure 9:
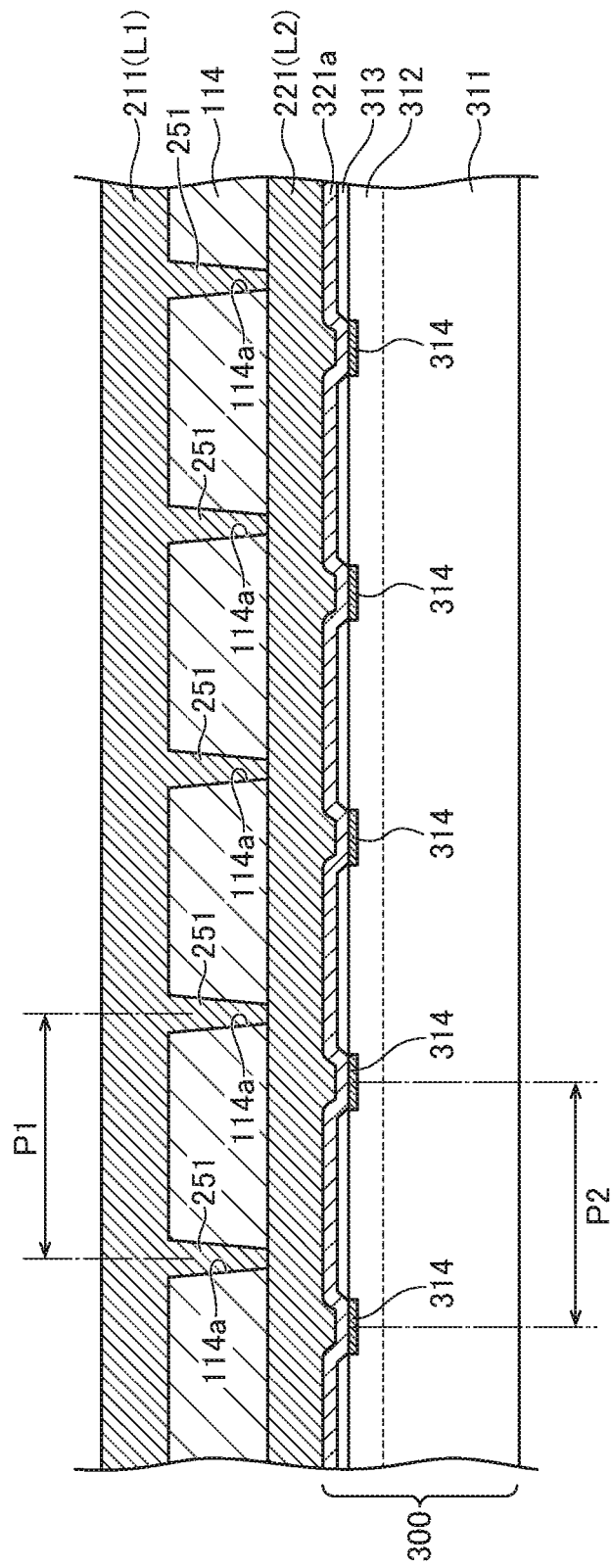
FIG. 9 is a schematic cross-sectional view illustrating a state where misalignment occurs in the first example shown in FIG. 8.

FIG. 8 is a schematic cross-sectional view illustrating a first example of the positional relationship between the pad electrodes 314 and the via conductors 251 (openings 114a). In the first example of FIG. 8, an arrangement pitch P1 of the via conductors 251 and an arrangement pitch P2 of the pad electrodes 314 are the same, and the pad electrodes 314 and the via conductors 251 overlap each other, respectively, in a plan view. With such a layout, heat dissipated from the pad electrodes 314 are linearly transmitted to the wiring pattern 211 on the shortest route through the via conductors 251, whereby a high heat dissipation property can be exhibited. However, in a case where the arrangement pitches P1 and P2 are made to coincide with each other as in the present example, if misalignment occurs at the formation of the via conductors 251, the pad electrodes 314 and the via conductors 251 may fail to overlap each other, as illustrated in FIG. 9. Therefore, accurate alignment is required.

Figure 10:
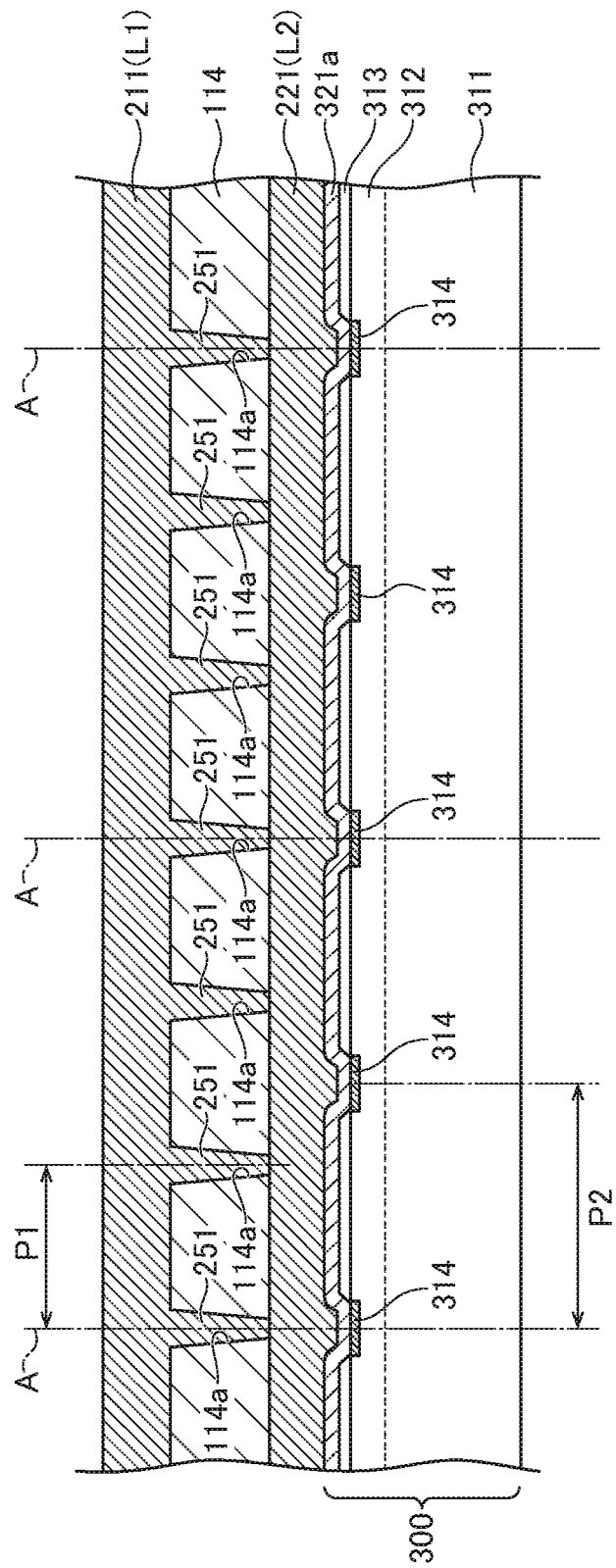
FIG. 10 is a schematic cross-sectional view illustrating a second example of the positional relationship between the pad electrodes and the via conductors (openings)

FIG. 10 is a schematic cross-sectional view illustrating a second example of the positional relationship between the pad electrodes 314 and the via conductors 251 (openings 114a). In the second example of FIG. 10, the arrangement pitch P1 of the via conductors 251 is designed to be smaller than the arrangement pitch P2 of the pad electrodes 314. With this configuration, the wiring pattern 211 and the wiring pattern 221 are connected to each other through more via conductors 251, so that the thermal resistance between the wiring patterns 211 and 221 is reduced, and heat dissipation characteristics can be made more uniform on a planar basis. In addition, the arrangement pitches P1 and P2 differ from each other, so that even if misalignment occurs at the formation of the via conductors 251, the via conductors 251 and the pad electrodes 314 overlap each other in a plan view at a certain probability, thus making it possible to prevent deterioration in the heat dissipation property due to the misalignment. In the example of FIG. 10, some pad electrodes 314 and some via conductors 251 are positioned on line A, and thus heat can be dissipated on the shortest route along the line A.

Figure 11:
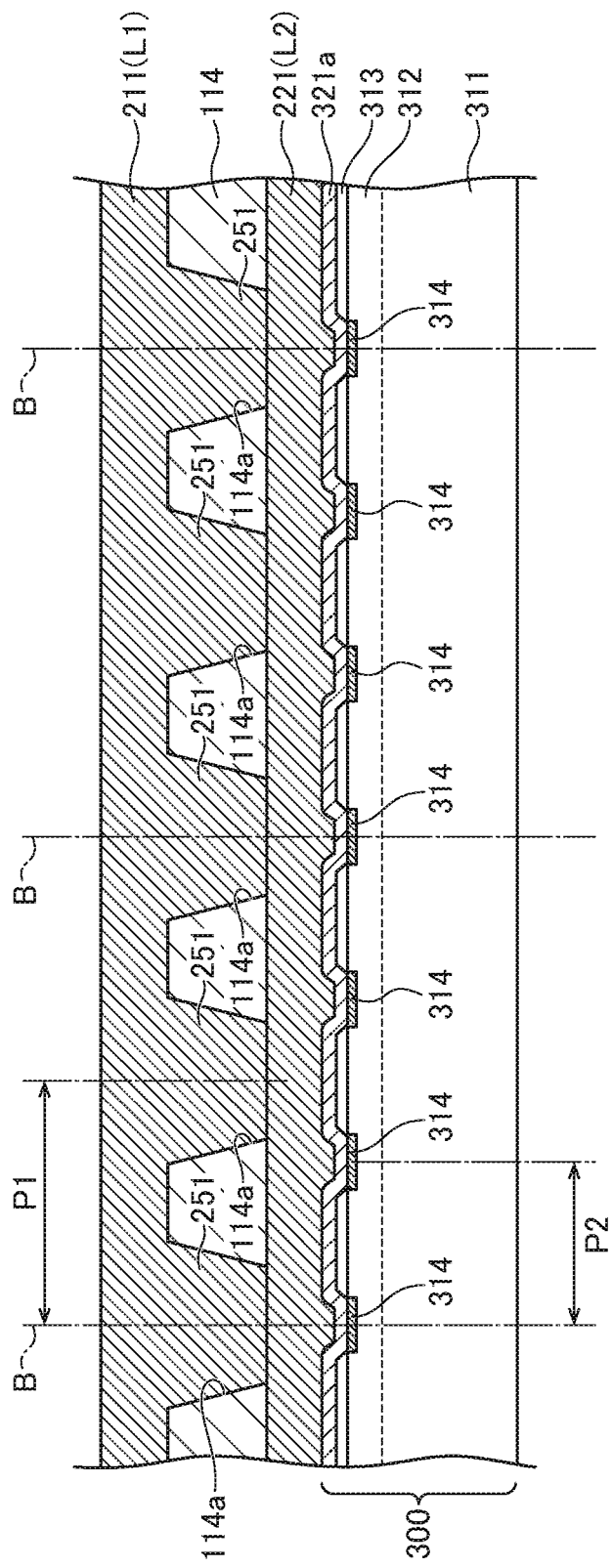
FIG. 11 is a schematic cross-sectional view illustrating a third example of the positional relationship between the pad electrodes and the via conductors (openings)

FIG. 11 is a schematic plan view illustrating a third example of the positional relationship between the pad electrodes 314 and the via conductors 251 (openings 114a). In the third example of FIG. 11, the arrangement pitch P1 of the via conductors 251 is designed to be larger than the arrangement pitch P2 of the pad electrodes 314. With this configuration, the thermal resistance between the wiring patterns 211 and 221 can be reduced by increasing the diameter of each of the via conductors 251. In addition, the arrangement pitches P1 and P2 differ from each other; therefore, as in the case of the second example illustrated in FIG. 10, even if misalignment occurs at the formation of the via conductors 251, the via conductors 251 and pad electrodes 314 overlap each other in a plan view at a certain probability, thus making it possible to prevent deterioration in the heat dissipation property due to the misalignment. In the example of FIG. 11, some pad electrodes 314 and some via conductors 215 are positioned on line B, and thus heat can be dissipated on the shortest route along the line B.

Figure 12:
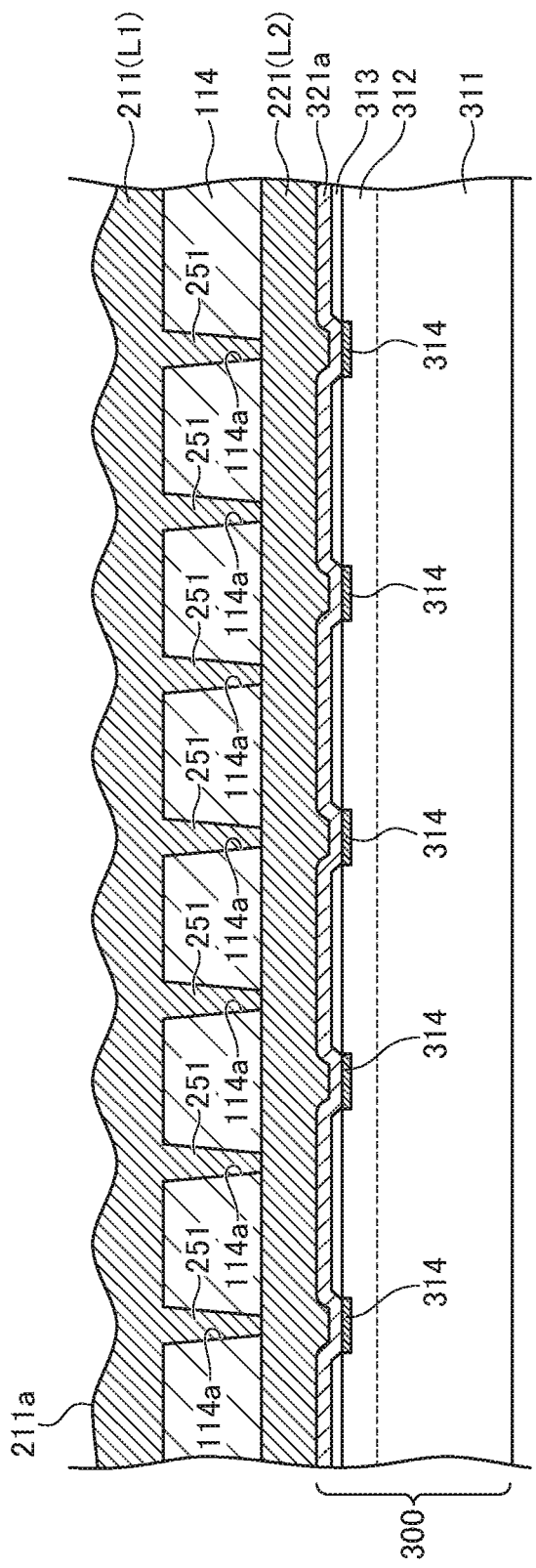
FIG. 12 is a schematic cross-sectional view illustrating an example in which a surface of the wiring pattern is an irregular surface.

Further, as illustrated in FIG. 12, a surface 211a of the wiring pattern 211 may be an irregular surface having recesses at locations overlapping the via conductors 251. By forming the surface 211a of the wiring pattern 211 into such a shape, the heat dissipation property can be further improved due to an increase in surface area.

Figure 13:
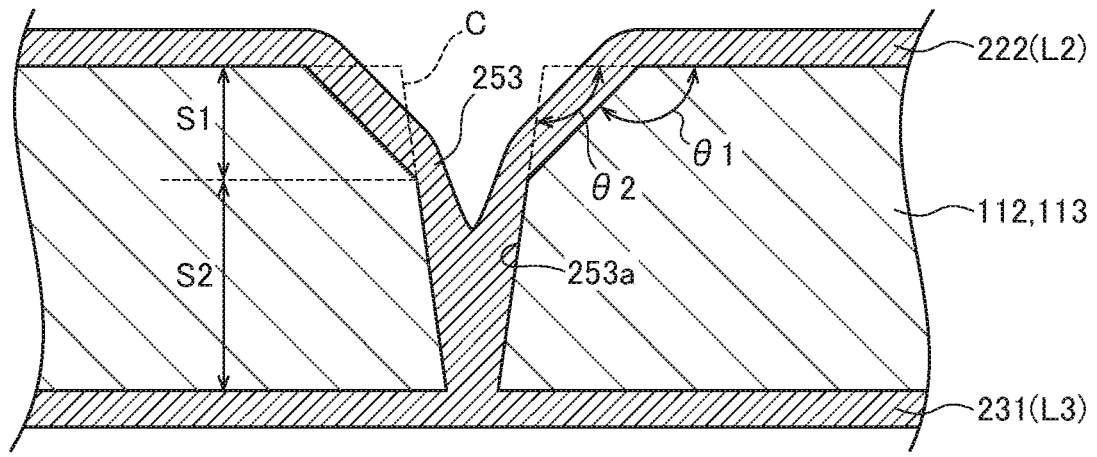
FIG. 13 is a schematic cross-sectional view for explaining a shape of a via.

Further, as illustrated in FIG. 13, a via 253a in which the via conductor 253 connecting the conductor layers L2 and L3 may be configured such that the diameter thereof is reduced in the depth direction and that the shape thereof in a section S1 positioned on the conductor layer L2 side and the shape in a section S2 positioned on the conductor layer L3 side differ from each other. In the example illustrated in FIG. 13, the inner wall of the via 253a is nearly vertical, having a steeper angle in the section S2 than in the section S1. In other words, a reduction in the diameter per unit depth in the section S1 is larger than that in the section S2. By forming the via 253a into such a shape, an angle θ1 between the inner wall in the section S1 and the surface of the insulating layer 113 becomes large, so that the coverage of the conductor layer L2 at the edge of the via 253a is enhanced, with the result that connection reliability of the via conductor 253 can be increased.

On the other hand, as denoted by dashed line C, when the entire via 253a has the same shape as the section S2, an angle θ2 at the edge of the via 253a becomes small, so that, at this portion, the film thickness of the conductor layer L2 may be reduced or disconnection may occur. Such a problem can be solved by forming the via 253a into the above-described shape. The shape illustrated in FIG. 13 is obtained by forming the via 253a from the conductor layer L2 side and, thus, when the via 253*a* is formed from the conductor layer L3 side, the vertical position of the first and second sections S1 and S2 is reversed from that illustrated in FIG. 13.

Figure 14:
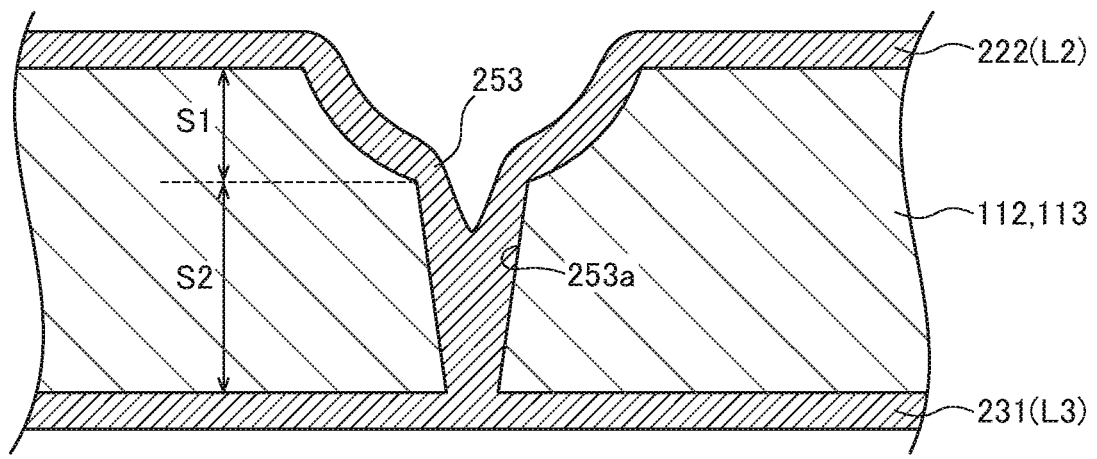
FIG. 14 is a schematic cross-sectional view for explaining a shape of a via according to a modification.

The shape of the section S1 may be curved as illustrated in FIG. 14. That is, a reduction in the diameter per unit depth in the section S1 may be increased as the position in the depth direction is reduced. Thus, the volume of each via 253*a* can be increased.

Figure 15:
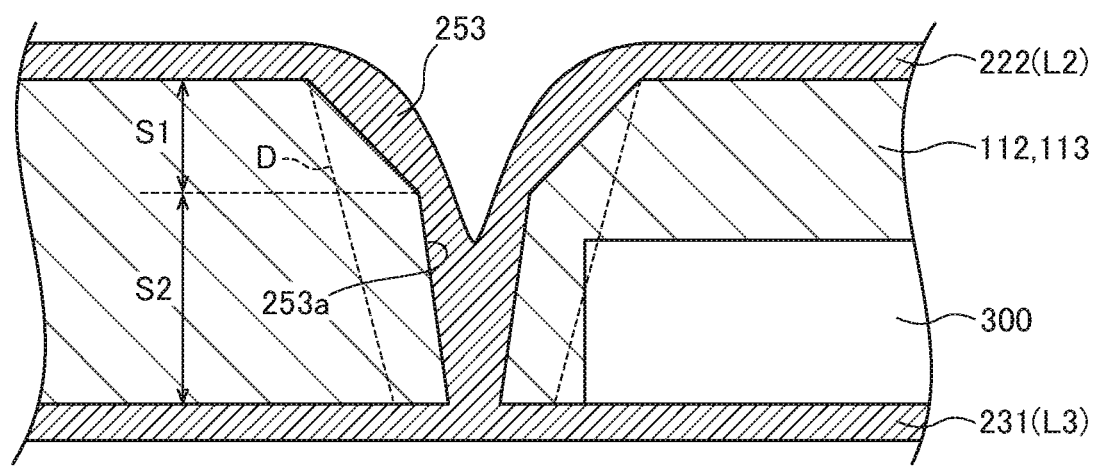
FIG. 15 is a schematic cross-sectional view for explaining the positional relationship between the via and semiconductor IC.

Further, when the via 253*a* is formed into the shape illustrated in FIG. 13 or FIG. 14, the distance between the semiconductor IC 300 and the via 253*a* can be reduced, as illustrated in FIG. 15. This allows a reduction in the planar size of the semiconductor IC-embedded substrate 100. That is, as denoted by dotted line D, when the inner wall of the via 253*a* is made linear with the diameter thereof at the upper end fixed, the semiconductor IC 300 cannot be disposed at the position illustrated in FIG. 15 but needs to be disposed in a position further away from the via 253*a*. On the other hand, when the via 253*a* is formed into the shape illustrated in FIG. 13 or FIG. 14, the semiconductor IC 300 can be brought closer to the via 253*a*. To achieve such an effect, the thickness of the semiconductor IC 300 may be reduced to less than the depth of the section S2, and the depth position of the semiconductor IC 300 may be set within the section S2.

The following describes a manufacturing method for the semiconductor IC-embedded substrate 100 according to the present embodiment.

FIGS. 16 to 27 are process views for explaining the manufacturing method for the semiconductor IC-embedded substrate 100 according to the present embodiment.

Figure 16:
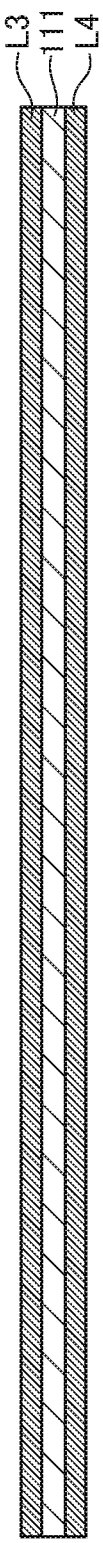
FIGS. 16 to 27 are process views for explaining the manufacturing method for the semiconductor IC-embedded substrate shown in FIG. 1.

As illustrated in FIG. 16, a base material (a work board) formed by attaching the conductor layers L3 and L4 made of a Cu foil to both surfaces of the insulating layer 111 including a core material such as glass fiber, i.e., a double-sided CCL (Copper Clad Laminate) is prepared. In order to ensure appropriate rigidity for easy handling, the thickness of the core material included in the insulating layer 111 is preferably equal to or more than 40 µm. The material of the conductor layers L3 and L4 is not particularly limited, and examples include metal conductive materials such as Au, Ag, Ni, Pd, Sn, Cr, Al, W, Fe, Ti and SUS in addition to the above-mentioned Cu and, among them, Cu is preferable in terms of conductivity and cost. The same applies to the conductor layers L1 and L2 to be described later.

The resin material forming the insulating layer 111 is not particularly limited as long as it can be formed into a sheet shape or a film shape, and examples include: a single element selected from the group consisting of vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+activated ester curing resin, polyphenylene ether resin (polyphenylene oxide resin), curable polyolefin resin, benzo cyclobutene resin, polyimide resin, aromatic polyester resin, aromatic liquid crystal polyester resin, polyphenylene sulfide resin, polyether imide resin, polyacrylate resin, polyetheretherketone resin, fluororesin, epoxy resin, phenolic resin, and benzoxazine resin in addition to glass epoxy; a material obtained by adding, to one of the above-listed resins, silica, talc, calcium carbonate, magnesium carbonate, aluminum hydroxide, magnesium hydroxide, aluminum borate whiskers, potassium titanate fiber, alumina, glass flakes, glass fiber, tantalum nitride, aluminum nitride, or the like; and a material obtained by adding, to one of the above-listed resins, metal oxide powder containing at least one metal selected from the group consisting of magnesium, silicon, titanium, zinc, calcium, strontium, zirconium, tin, neodymium, samarium, aluminum, bismuth, lead, lanthanum, lithium and tantalum, and these examples may be selectively used as appropriate from the viewpoints of electrical characteristics, mechanical characteristics, water absorption properties, reflow durability, etc. Further, examples of the core material included in the insulating layer 111 include a material blended with, e.g., resin fiber such as glass fiber or aramid fiber. The same is true on the other insulating layers 112 to 114 described later.

Figure 17:
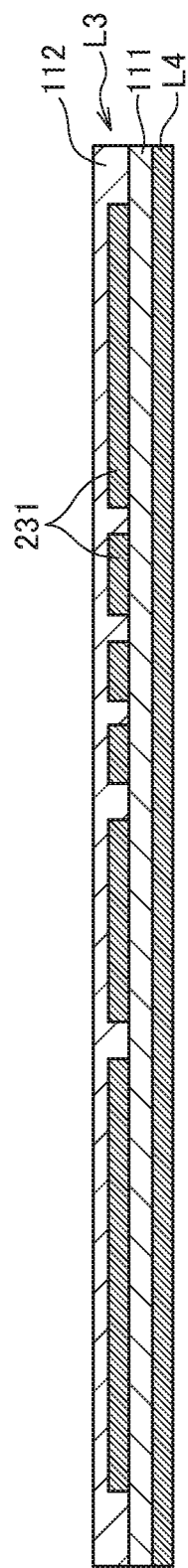

Then, as illustrated in FIG. 17, a known method such as photolithography is used to pattern the conductor layer L3 to form the wiring pattern 231. Further, for example, an uncured (B stage) resin sheet is laminated on the surface of the insulating layer 111 by vacuum pressure bonding or the like so as to embed therein the wiring pattern 231 to thereby form the insulating layer 112.

Figure 18:
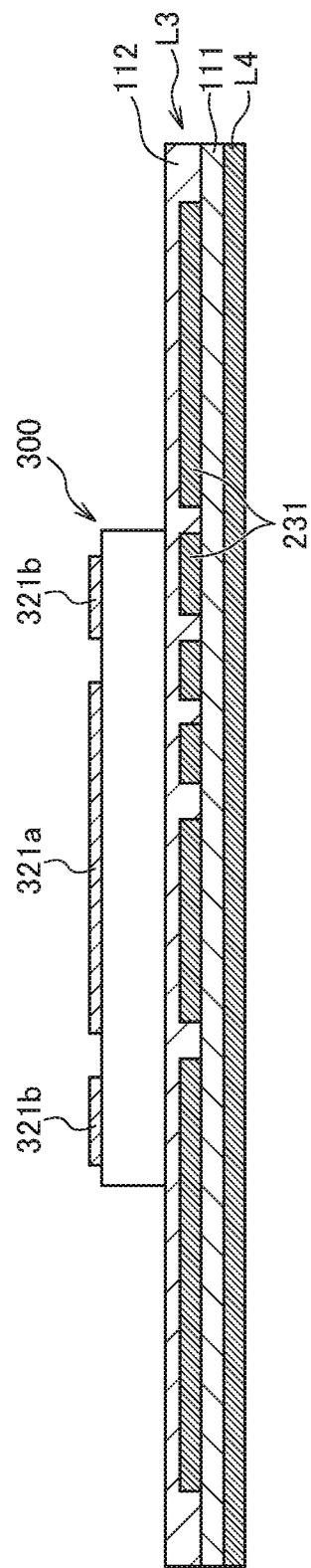

Then, as illustrated in FIG. 18, the semiconductor IC 300 is placed on the insulating layer 112. The semiconductor IC 300 is face-up mounted such that the main surface thereof on which the rewiring patterns 321*a* and 321*b* are exposed face upward. As describe above, the semiconductor IC 300 may be made thinner. Specifically, the thickness of the semiconductor IC 300 is, e.g., equal to or less than 200 µm, preferably, about 50 µm to about 100 µm. In terms of cost, it is preferable to simultaneously apply machining to many semiconductor ICs 300 in a wafer state and, in this case, the back surface is first ground, and then the wafer is diced to obtain individual semiconductor ICs 300. Alternatively, when the wafer is diced into individual semiconductor ICs 300 or half-cut before thinning by means of polishing, the back surface can be polished while the main surface of the semiconductor IC 300 is covered with a thermosetting resin. Thus, there are various possible processing orders among insulating film grinding, electronic component back surface grinding and dicing. Further, the back surface of the semiconductor IC 300 can be roughened by etching, plasma processing, laser processing, blasting, polishing with a grinder, buffing, chemical treatment or the like. With these methods, it is possible to not only achieve thinning of the semiconductor IC 300, but also to enhance adhesion to the insulating layer 112.

Figure 19:
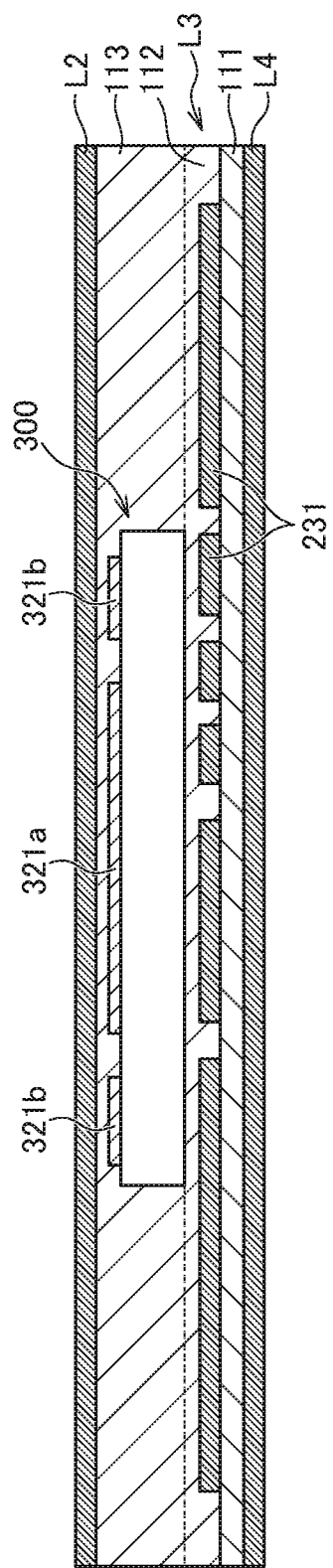

Then, as illustrated in FIG. 19, the insulating layer 113 and the conductor layer L2 are formed so as to cover the semiconductor IC 300. Preferably, the insulating layer 113 is formed as follows: after application of an uncured or semi-cured thermosetting resin, the resin (when it is an uncured resin) is semi-cured by heating, and then the semi-cured resin and the conductor layer L2 are pressed together by a pressing means to obtain a cured insulating layer 113. The insulating layer 113 is preferably a resin sheet not containing fiber that prevents the embedding of the semiconductor IC 300. This enhances adhesion among the insulating layer 113, conductor layer L2, insulating layer 112 and semiconductor IC 300.

Figure 20:
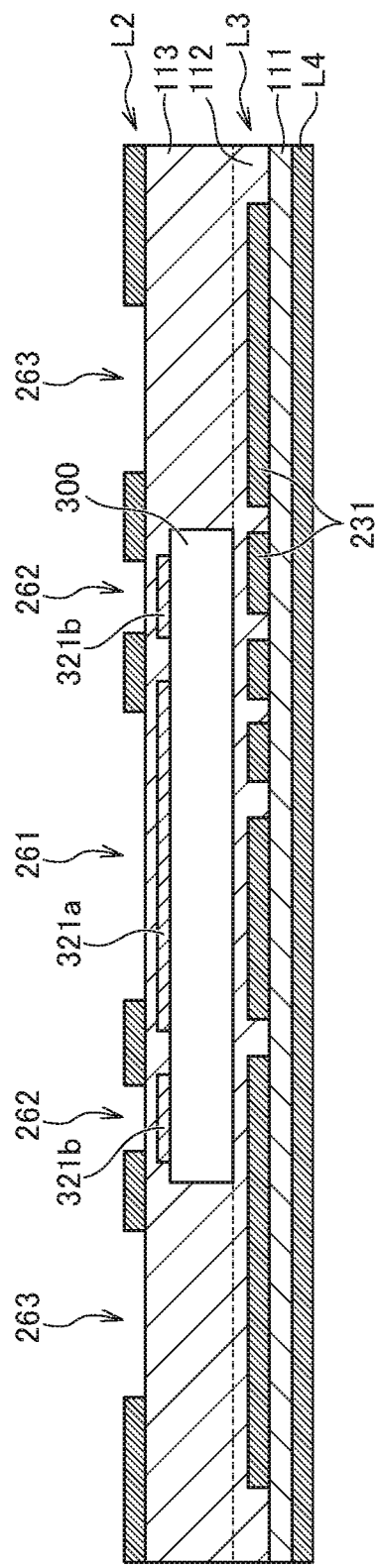

Then, as illustrated in FIG. 20, a part of the conductor layer L2 is etched away using a known method such as photolithography to form openings 261 to 263 exposing the insulating layer 113. The opening 261 is formed at a location overlapping the rewiring pattern 321*a*, the opening 262 is formed at a location overlapping the rewiring pattern 321*b*, and the opening 263 is formed at a location not overlapping the semiconductor IC 300 but overlapping the wiring pattern 231 of the conductor layer L3. The diameter of the opening 261 is smaller than the planar size of the rewiring pattern 321*a*, whereby the entire opening 261 overlaps the rewiring pattern 321a in a plan view. Similarly, the diameter of the opening 262 is smaller than the planar size of the rewiring pattern 321b, whereby the entire opening 262 overlaps the rewiring pattern 321b in a plan view.

Figure 21:
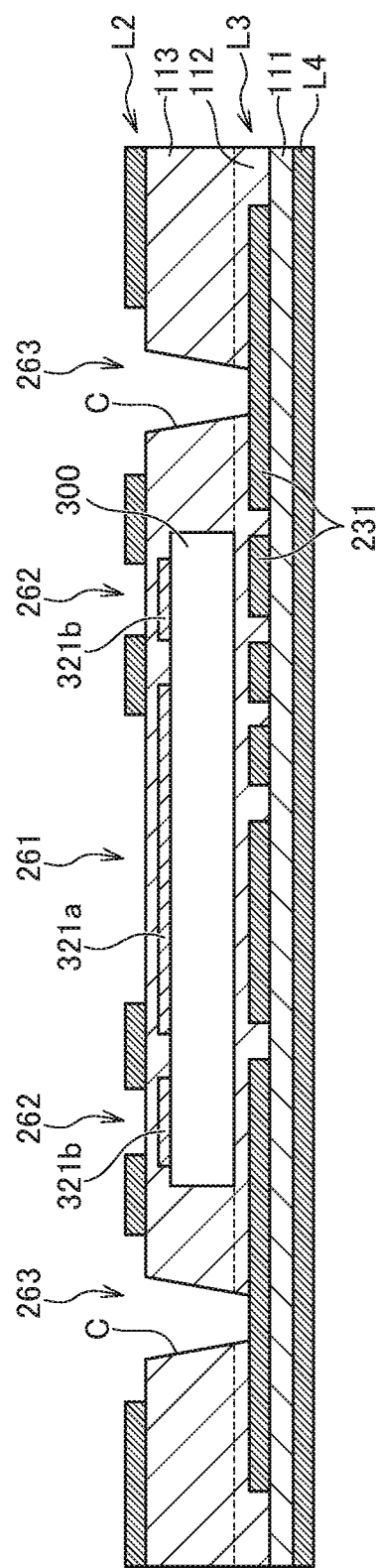

Then, as illustrated in FIG. 21, laser processing is applied to the center of the opening 263 to form a via C in the insulating layers 112 and 113. The via C is formed corresponding to dashed line C in FIG. 13. That is, the entire via C has the same shape as the section S2. The laser light is not irradiated on the entire opening 263, but only on the center thereof so as to leave a ring-shaped unprocessed region.

Figure 22:
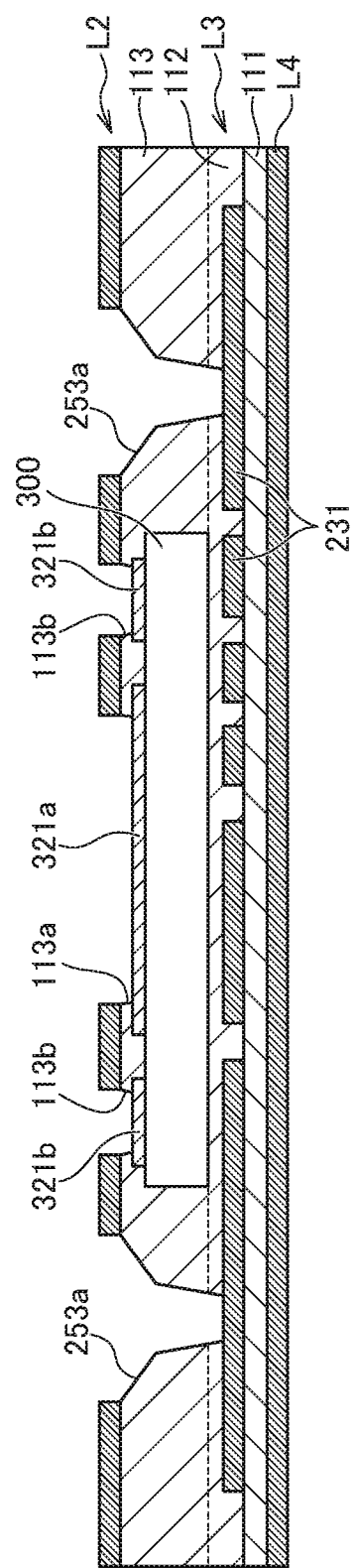

Then, as illustrated in FIG. 22, blasting is applied with the conductor layer L2 as a mask to remove the insulating layer 113 at a portion where it is not covered with the conductor layer L2. As a result, the opening 113a is formed in the insulating layer 113 at a location corresponding to the opening 261 of the conductor layer L2 to expose the rewiring pattern 321a. Similarly, the opening 113b is formed in the insulating layer 113 at a location corresponding to the opening 262 of the conductor layer L2 to expose the rewiring pattern 321b. Further, at a location corresponding to the opening 263 of the conductor layer L2, the diameter of the upper portion of the via C is increased by the blasting, whereby the via 253a having the sections S1 and S2 illustrated in FIG. 13 is formed. Thus, the via 253a is subjected to laser processing and then to blasting to have a shape having the sections S1 and S2 illustrated in FIG. 13. Therefore, the shape of the section S1 is mainly attributable to the blasting, and the shape of the section S2 is mainly attributable to the laser processing.

Figure 23:
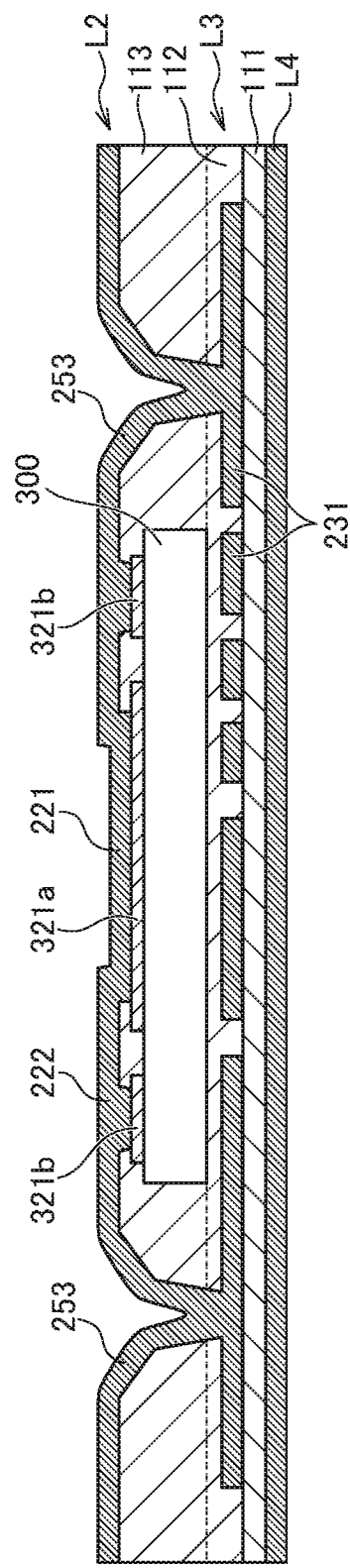

Then, as illustrated in FIG. 23, electroless plating and electrolytic plating are applied to form the via conductor 253 and to form the wiring patterns 221 and 222 contacting the rewiring patterns 321a and 321b, respectively.

Figure 24:
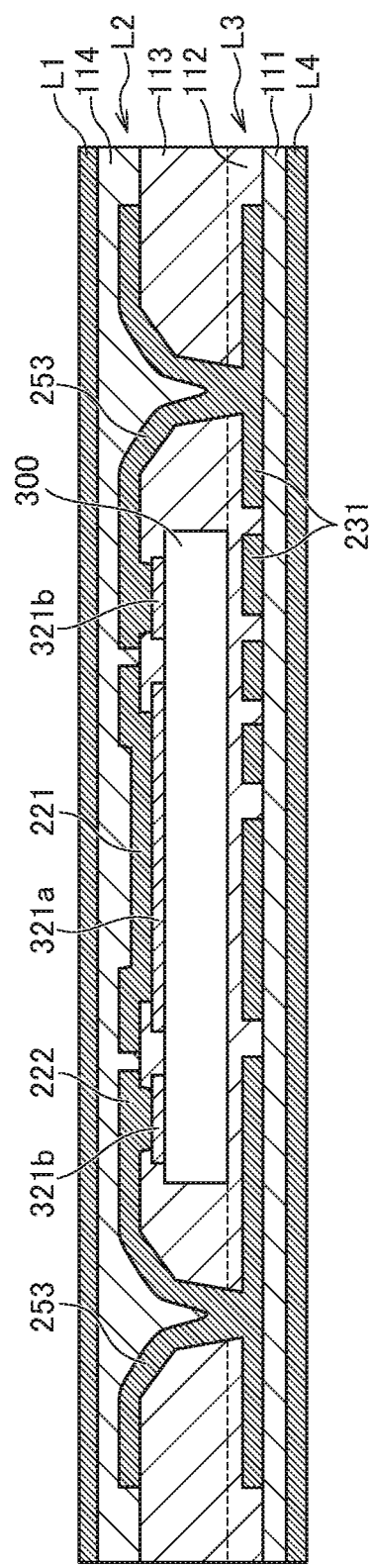

Then, as illustrated in FIG. 24, the wiring patterns 221 and 222 are patterned by a known method to separate them from each other. Thereafter, a sheet having the insulating layer 114 and the conductor layer L1 laminated thereon is hot-pressed under vacuum so as to embed therein the conductor layer L2. The material and thickness of the insulating layer 114 may be the same as those of the insulating layer 111.

Figure 25:
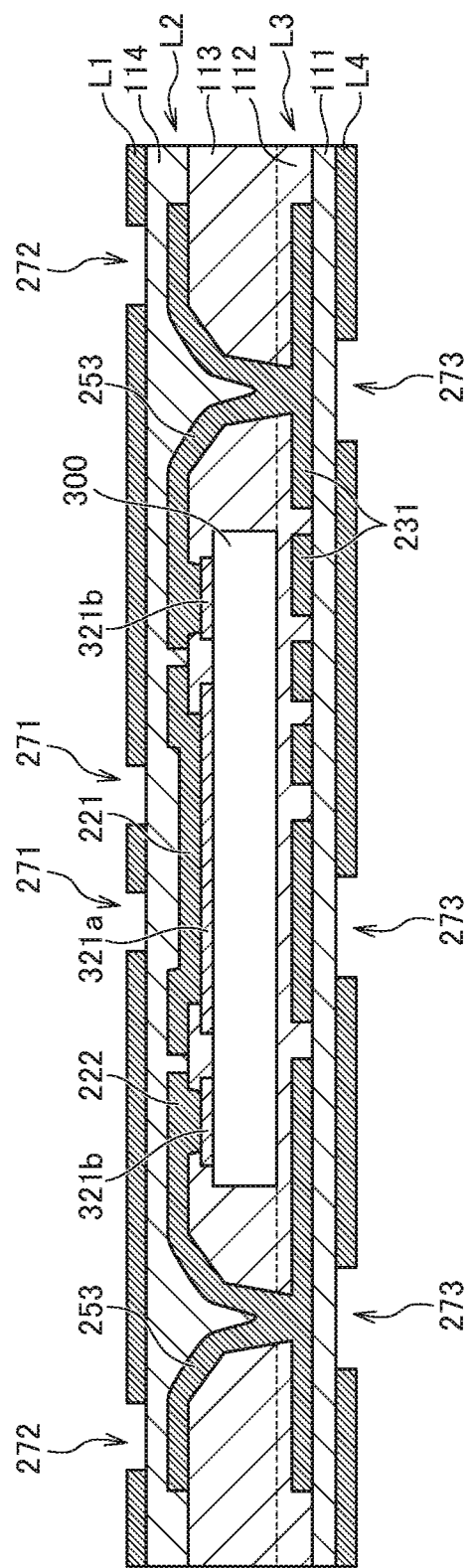

Then, as illustrated in FIG. 25, a part of the conductor layer L1 and a part of the conductor layer L4 are etched away using a known method such as photolithography to form openings 271 and 272 exposing the insulating layer 114 and an opening 273 exposing the insulating layer 111. The opening 271 is formed in a plural number at a location overlapping the wiring pattern 221, the opening 272 is formed at a location overlapping the wiring pattern 222, and the opening 273 is formed at a location overlapping the wiring pattern 231. The wiring pattern 221 is provided at a location overlapping the semiconductor IC 300, so that the opening 271 is also formed at a location overlapping the semiconductor IC 300. Although the opening 272 is formed at a location not overlapping the semiconductor IC 300 in the example of FIG. 25, some openings 272 may be formed at locations overlapping the semiconductor IC 300.

Figure 26:
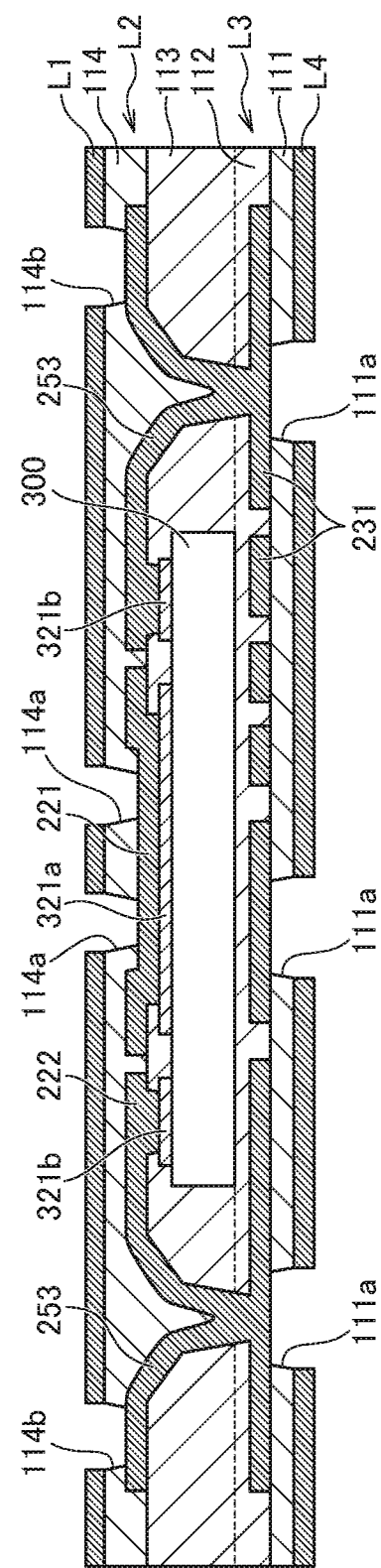

Then, as illustrated in FIG. 26, known blasting or laser processing is applied to the openings 271 to 273 to remove a part of the insulating layer 114 that is not covered with the conductor layer L1 and a part of the insulating layer 111 that is not covered with the conductor layer L4. As a result, the opening 114a is formed in the insulating layer 114 at a location corresponding to the opening 271 of the conductor layer L1 to expose the wiring pattern 221. Similarly, the opening 114b is formed in the insulating layer 114 at a location corresponding to the opening 272 of the conductor layer L1 to expose the wiring pattern 222. Further, the wiring pattern 231 is exposed at a location corresponding to the opening 111a of the conductor layer L4.

Figure 27:
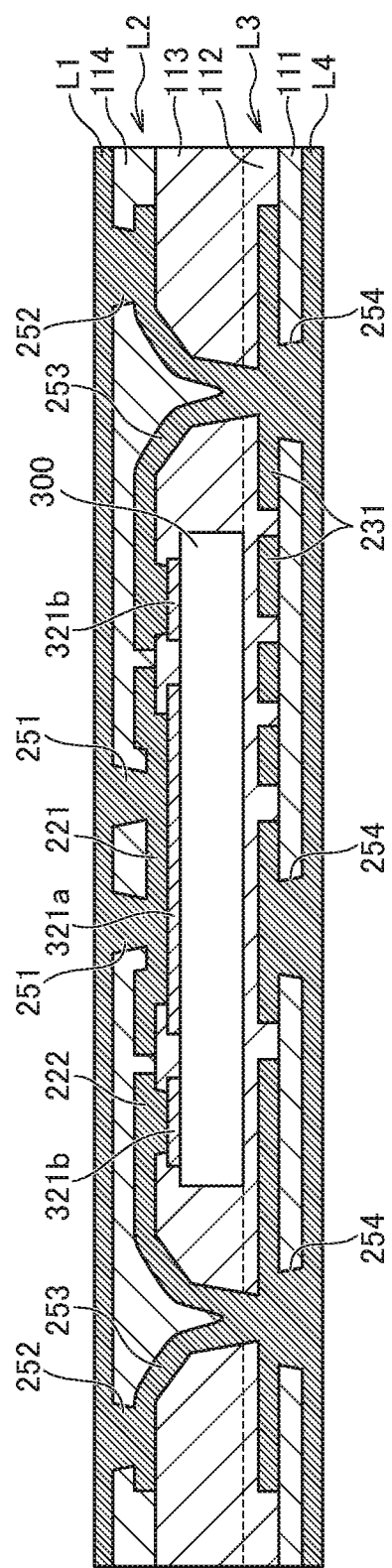

Then, as illustrated in FIG. 27, electroless plating and electrolytic plating are applied to form the via conductors 254, 251 and 252 inside the openings 111a, 114a and 114b, respectively. After that, a known method such as photolithography is used to pattern the conductor layers L1 and L4 to form the wiring patterns 211 and 212 in the conductor layer L1 and the wiring patterns 241 and 242 in the conductor layer L4, as illustrated in FIG. 1. Then, the solder resists 121 and 122 are each formed in a predetermined planar position, followed by mounting of the electronic component 400 and formation of the mold resin 130, whereby the semiconductor IC-embedded substrate 100 according to the present embodiment is completed.

As described above, in the present embodiment, a structure contributing to heat dissipation, i.e., the heat dissipation structure connecting the pad electrodes 314 and the wiring pattern 211 is not formed by a separate process, but can be formed simultaneously with a process for obtaining a structure connecting the signal or power supply pad electrodes 315 and the wiring pattern 212, thus allowing the semiconductor IC-embedded substrate 100 to be manufactured with a less number of processes. In addition, in forming the via 253a connecting the conductor layers L2 and L3, two-stage processing including the laser processing and blasting is performed, so that the via 253a can be formed into the shape illustrated in FIG. 13, thus making it possible to increase the connection reliability of the via conductor 253 to be formed inside the via 253a.

It is apparent that the present invention is not limited to the above embodiments, but may be modified and changed without departing from the scope and spirit of the invention.

What is claimed is:
1. A semiconductor IC-embedded substrate comprising:
a plurality of insulating layers;
a plurality of conductor layers; and
a semiconductor IC embedded in at least one of the plurality of insulating layers,
wherein the semiconductor IC includes a main surface, a back surface positioned opposite to the main surface, a plurality of pad electrodes provided on the main surface, and a rewiring layer covering the main surface and connected to the plurality of pad electrodes,
wherein the rewiring layer includes a first rewiring pattern connected in common to a plurality of power supply pads included in the plurality of electrode pads,
wherein the plurality of insulating layers include a first insulating layer that covers the main surface of the semiconductor IC,
wherein the first insulating layer has a first opening exposing the first rewiring pattern at a location directly overlapping the plurality of power supply pads,
wherein the plurality of conductor layers include a first conductor layer provided on the first insulating layer such that the first insulating layer is sandwiched between the rewiring layer and the first conductor layer in a stacking direction,
wherein the first conductor layer includes a first wiring pattern overlapping the first rewiring pattern in the stacking direction and connected to the first rewiring pattern through the first opening,
wherein the plurality of insulating layers further include a second insulating layer that covers the first conductor layer, wherein the second insulating layer has a plurality of second openings formed at a location directly overlapping the first opening, wherein the plurality of conductor layers further include a second conductor layer provided on the second insulating layer, and wherein the second conductor layer includes a second wiring pattern connected to the first wiring pattern through the plurality of second openings.

2. The semiconductor IC-embedded substrate as claimed in claim 1, wherein any of the plurality of power supply pads and any of the plurality of second openings overlap each other in a plan view.

3. The semiconductor IC-embedded substrate as claimed in claim 2, wherein an arrangement pitch of the plurality of power supply pads and an arrangement pitch of the plurality of second openings differ from each other.

4. The semiconductor IC-embedded substrate as claimed in claim 3, wherein the arrangement pitch of the plurality of second openings is smaller than the arrangement pitch of the plurality of power supply pads.

5. The semiconductor IC-embedded substrate as claimed in claim 3, wherein the arrangement pitch of the plurality of second openings is larger than the arrangement pitch of the plurality of power supply pads.

6. The semiconductor IC-embedded substrate as claimed in claim 1, wherein a surface of the second wiring pattern has recesses overlapping the plurality of second openings, respectively.

7. The semiconductor IC-embedded substrate as claimed in claim 1, wherein the plurality of conductor layers further include a third conductor layer positioned on a back surface side of the semiconductor IC, wherein the first conductor layer is connected to the third conductor layer at a location not overlapping the semiconductor IC in a plan view through a via conductor formed inside a via penetrating at least one of the plurality of insulating layers, wherein the via has a shape in which a diameter thereof is reduced in a depth direction, wherein the via has a first section positioned on one of a first conductor layer side and a third conductor layer side and a second section positioned on another of the first conductor layer side and the third conductor layer side, and wherein a reduction in the diameter per unit depth in the first section is larger than that a reduction in the diameter per unit depth in the second section.

8. The semiconductor IC-embedded substrate as claimed in claim 1, wherein the rewiring layer includes a plurality of second rewiring patterns each connected to an associated one of a plurality of signal pads included in the plurality of pad electrodes, and wherein the first rewiring pattern is greater in area than each of the second rewiring patterns.

9. The semiconductor IC-embedded substrate as claimed in claim 8, wherein the first opening is greater in area than each of the second rewiring patterns.

10. The semiconductor IC-embedded substrate as claimed in claim 1, wherein any of the plurality of power supply pads, the first opening, and any of the plurality of second openings overlap one another in a plan view.

11. The semiconductor IC-embedded substrate as claimed in claim 1, wherein the first insulating layer is located between the main surface of the semiconductor IC and the second insulating layer.

12. A method for manufacturing a semiconductor IC-embedded substrate, the method comprising:

covering a main surface of a semiconductor IC with a first insulating layer, the semiconductor IC having the main surface, a back surface positioned opposite to the main surface, a plurality of pad electrodes provided on the main surface, and a rewiring layer covering the main surface and connected to the plurality of pad electrodes, the rewiring layer including a rewiring pattern connected in common to a plurality of power supply pads included in the plurality of pad electrodes;

forming a first opening in the first insulating layer to expose the rewiring pattern at a location overlapping the plurality of power supply pads;

forming a first conductor layer on the first insulating layer such that the first insulating layer is sandwiched between the rewiring layer and the first conductor layer in a stacking direction to connect a first wiring pattern included in the first conductor layer to the rewiring pattern through the first opening such that the first writing pattern overlaps the first rewiring pattern in the stacking direction;

forming a second insulating layer covering the first conductor layer;

forming a plurality of second openings in the second insulating layer to expose the first wiring pattern at a location overlapping the first opening; and forming a second conductor layer on the second insulating layer to connect a second wiring pattern included in the second conductor layer to the first wiring pattern through the plurality of second openings.

13. An apparatus comprising:

a semiconductor chip having a main surface in which a first electrode and a plurality of second electrodes are formed, the second electrodes surrounding the first electrode, the first electrode being greater in area than each of the second electrodes;

a first insulating layer covering the first and second electrodes, the first insulating layer having a first opening that exposes the first electrode and a plurality of second openings that expose the second electrodes, the first opening being greater in area than each of the second openings;

a first conductor layer formed on the first insulating layer, the first conductor layer having a first conductor pattern connected to the first electrode via the first opening and a plurality of second conductor patterns connected to the second electrodes via the second openings, the first conductor pattern being greater in area than each of the second conductor patterns;

a second insulating layer covering the first and second conductor patterns, the second insulating layer having a plurality of third openings that expose the first conductor pattern, each of the third openings being smaller in area than the first openings; and a second conductor layer formed on the second insulating layer, the second conductor layer having a third conductor pattern connected to the first conductor pattern via the third openings, the third conductor pattern being greater in area than the first conductor pattern.

14. The apparatus as claimed in claim 13,
wherein the semiconductor chip has a side surface substantially perpendicular to the main surface, and
wherein the side surface is covered with the first insulating layer.

15. The apparatus as claimed in claim 14,
wherein the semiconductor chip further has a back surface located opposite to the main surface, and
wherein the back surface is completely covered with a third insulating layer stacked on the first insulating layer.

16. The apparatus as claimed in claim 13, wherein the first conductor pattern is greater in area than the first electrode.

17. The apparatus as claimed in claim 13, further comprising a solder resist covering a part of the second conductor layer,
wherein at least a part of the third conductor pattern is exposed without covered with the solder resist.

18. The apparatus as claimed in claim 17,
wherein the third conductor pattern has a first region covered with the solder resist and a second region exposed from the solder resist, and
wherein the second region is greater in area than the first region.

19. The apparatus as claimed in claim 13, wherein the first insulating layer is located between the main surface of the semiconductor chip and the second insulating layer.

20. The apparatus as claimed in claim 13, wherein the first conductor layer is located between the main surface of the semiconductor chip and the second conductor layer.

* * * * *